US011989371B2

(12) United States Patent
Heo et al.

(10) Patent No.: US 11,989,371 B2
(45) Date of Patent: May 21, 2024

(54) DISPLAY DEVICE AND OPERATING METHOD THEREOF

(71) Applicant: SAMSUNG DISPLAY CO., LTD., Yongin-si (KR)

(72) Inventors: Sanghyun Heo, Hwaseong-si (KR); Jiwoong Kim, Suwon-si (KR); Hyunggun Ma, Seoul (KR); Kyungtea Park, Seoul (KR); Seongan Park, Hwaseong-si (KR); Seongjoo Lee, Suwon-si (KR); Taehun Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 63 days.

(21) Appl. No.: 17/825,862

(22) Filed: May 26, 2022

(65) Prior Publication Data

US 2023/0090024 A1    Mar. 23, 2023

(30) Foreign Application Priority Data

Sep. 17, 2021    (KR) .................. 10-2021-0124569

(51) Int. Cl.
*G06F 3/041*    (2006.01)
*G06F 3/044*    (2006.01)
*H10K 59/122*    (2023.01)

(52) U.S. Cl.
CPC .... *G06F 3/04182* (2019.05); *G06F 3/041662* (2019.05); *G06F 3/04164* (2019.05); (Continued)

(58) Field of Classification Search
CPC ........... G06F 3/04182; G06F 3/041662; G06F 3/0446; G06F 3/04164; G06F 2203/04106; H01L 27/3246
(Continued)

(56) References Cited

U.S. PATENT DOCUMENTS 9,891,762 B2    2/2018  Lee et al.
10,996,792 B2   5/2021  Yun et al.
(Continued)

FOREIGN PATENT DOCUMENTS

KR    10-2087332    3/2020

OTHER PUBLICATIONS

Jun-Eun Park et al., "A Noise-Immunity-Enhanced Analog Front-End for 36×64 Touch-Screen Controllers With 20-Vpp Noise Tolerance at 100 KHz", IEEE Journal of Solid-State Circuits, vol. 54, No. 5, May 2019, pp. 1497-1510.

*Primary Examiner* — Mark Edwards
(74) *Attorney, Agent, or Firm* — F. Chau & Associates, LLC

(57) ABSTRACT

A display device includes a display panel, an input sensor having a plurality of first sensing electrodes and a plurality of second sensing electrodes, and a readout circuit that includes a noise filter electrically connected to the plurality of first sensing electrodes and the plurality of second sensing electrodes to remove noise of a receiving signal received from the plurality of first sensing electrodes and the plurality of second sensing electrodes. The readout circuit determines which of the first sensing electrodes are influenced by a touch based on the receiving signal as influenced electrodes, during a first sensing mode. The readout circuit adjusts a passband of the noise filter based on the number of influenced electrode and transmits a transmitting signal to the influenced electrodes, during a second sensing mode.

21 Claims, 21 Drawing Sheets

(52) U.S. Cl.
CPC .. *G06F 3/0446* (2019.05); *G06F 2203/04106* (2013.01); *H10K 59/122* (2023.02)

(58) Field of Classification Search
USPC ........................................................ 345/174
See application file for complete search history.

(56) References Cited

U.S. PATENT DOCUMENTS

| | | | |
|---|---|---|---|
| 2013/0176269 A1* | 7/2013 | Sobel | G06F 3/04166 |
| | | | 327/306 |
| 2015/0077386 A1 | 3/2015 | Huang et al. | |
| 2016/0283023 A1* | 9/2016 | Shin | A61M 5/178 |
| 2020/0363952 A1 | 11/2020 | Wang et al. | |
| 2021/0157428 A1* | 5/2021 | Jordan | H03K 17/9622 |

* cited by examiner

DISPLAY DEVICE AND OPERATING METHOD THEREOF

CROSS-REFERENCE TO RELATED APPLICATIONS

This U.S. non-provisional patent application claims priority under 35 U.S.C. § 119 to Korean Patent Application No. 10-2021-0124569 filed on Sep. 17, 2021, in the Korean Intellectual Property Office, the disclosure of which is incorporated by reference in its entirety herein.

1. Technical Field

Embodiments of the present disclosure described herein relate to a display device, and more particularly, relate to a display device capable of sensing a touch input.

2. Discussion of Related Art

Multimedia electronic devices such as televisions, mobile phones, tablet computers, navigation devices, and game consoles include a display device for displaying an image. The display device may include a touch screen capable of allowing a user to enter information or commands easily and intuitively.

Examples of touch screens includes mutual-capacitive touch screens and self-capacitive touch screens. Noise may adversely impact the ability of a touch screen to detect a location of a touch. While adjustments can be made to reduce noise, some of these adjustments introduce a signal delay, thereby reducing the performance of the touch screen.

SUMMARY

Embodiments of the present disclosure provide a display device with increased touch sensing performance and an operating method thereof.

According to an embodiment of the present disclosure, a display device includes a display panel that displays an image, an input sensor disposed on the display panel and that includes a plurality of first sensing electrodes and a plurality of second sensing electrodes, and a readout circuit that includes a noise filter electrically connected to the plurality of first sensing electrodes and the plurality of second sensing electrodes to remove noise of a receiving signal received from the plurality of first sensing electrodes and the plurality of second sensing electrodes. The readout circuit determines which of the first sensing electrodes from among the plurality of first sensing electrodes are influenced by a touch based on the receiving signal as influenced electrodes, during the first sensing mode. The readout circuit adjusts a passband of the noise filter based on the number of influenced electrodes and transmits a transmitting signal to the influenced electrodes, during a second sensing mode.

According to an embodiment, as the number of influenced electrodes decreases, the passband of the noise filter may become narrower.

According to an embodiment, the readout circuit may provide a Q factor signal to the noise filter based on the number of influenced electrodes, and as a Q factor level of the Q factor signal becomes high, the passband of the noise filter may become narrower.

According to an embodiment, the readout circuit may include a receiver that receives the receiving signal from the plurality of first sensing electrodes and the plurality of second sensing electrodes to output a sensing signal, a transmitter that transmits the transmitting signal to the influenced electrodes, and a control circuit that controls the receiver and the transmitter, and the control circuit may determine the influenced electrodes from among the plurality of first sensing electrodes based on the sensing signal.

According to an embodiment, the receiver may include the noise filter that removes noise of the receiving signal in response to a Q factor signal, and the control circuit may provide the Q factor signal to the noise filter based on the number of influenced electrodes.

According to an embodiment, the receiver may receive the receiving signal from the plurality of first sensing electrodes during the first sensing mode.

According to an embodiment, the receiver may receive the receiving signal from the plurality of first sensing electrodes during a first section of the first sensing mode, and may receive the receiving signal from the plurality of second sensing electrodes during a second section of the first sensing mode.

According to an embodiment, the display device may further include first sensing lines electrically connecting the plurality of first sensing electrodes to the readout circuit, and second sensing lines electrically connecting the plurality of second sensing electrodes to the readout circuit.

According to an embodiment, the noise filter may be a band pass filter.

According to an embodiment, the passband of the noise filter is a first range when the number of influenced electrodes is a first value and a second range smaller than the first range when the number is a second value less than the first value.

According to an embodiment of the present disclosure, a display device includes a display panel that displays an image, an input sensor disposed on the display panel and that includes a plurality of first sensing electrodes and a plurality of second sensing electrodes, and a readout circuit that includes a noise filter electrically connected to the plurality of first sensing electrodes and the plurality of second sensing electrodes to remove noise of a receiving signal received from the plurality of first sensing electrodes and the plurality of second sensing electrodes. The readout circuit determines which of the first sensing electrodes from among the plurality of first sensing electrodes are influenced by a touch based on the receiving signal as influenced electrodes, during a first sensing mode. The readout circuit transmits a transmitting signal to the influenced electrodes, during a second sensing mode. A Q factor of the noise filter during the first sensing mode is at a first level, and the Q factor of the noise filter during the second sensing mode is at a second level different from the first level.

According to an embodiment, during the first sensing mode, a Q factor of the noise filter may be determined based on the number of the influenced electrodes.

According to an embodiment, during the second sensing mode, the Q factor of the noise filter may be determined based on the number of influenced electrodes.

According to an embodiment, the readout circuit may include a receiver that receives the receiving signal from the plurality of first sensing electrodes and the plurality of second sensing electrodes and outputs a sensing signal, a transmitter that transmits the transmitting signal to the influenced electrodes, and a control circuit that controls the receiver and the transmitter, and the control circuit may determine the influenced electrodes from among the plurality of first sensing electrodes based on the sensing signal.

According to an embodiment, the receiver may receive the receiving signal from the plurality of first sensing electrodes during the first sensing mode.

According to an embodiment, the receiver may receive the receiving signal from the plurality of first sensing electrodes during a first section of the first sensing mode, and may receive the receiving signal from the plurality of second sensing electrodes during a second section of the first sensing mode.

According to an embodiment, the noise filter may be a band pass filter.

According to an embodiment of the present disclosure, a method of operating a display device which includes an input sensor and a readout circuit includes receiving a receiving signal from a plurality of first sensing electrodes and a plurality of second sensing electrodes of the input sensor, determining which of the first sensing electrodes from among the plurality of first sensing electrodes are influenced by a touch as influenced electrodes, adjusting a passband of the noise filter based on the number of influenced electrodes, and transmitting a transmitting signal to the influenced electrodes.

According to an embodiment, as the number of influenced electrodes decreases, the passband of the noise filter may become narrower.

According to an embodiment, the readout circuit may provide a Q factor signal to the noise filter based on the number of influenced electrodes, and as a Q factor level of the Q factor signal becomes high, the passband of the noise filter may become narrower.

According to an embodiment, the adjusting includes setting the passband to a first range when the number of influenced electrodes is a first value and setting the passband to a second range lower than the first range when the number is a second value less than the first value.

According to an embodiment, the noise filter may be a band pass filter.

According to an embodiment of the present disclosure, a display device includes a display panel that displays an image, a touch sensor disposed on the display panel and including a plurality of transmitting and receiving electrodes, and a readout circuit including a noise filter electrically connected to the transmitting electrodes and the receiving electrodes for receiving a receiving signal. The readout circuit determines which of the transmitting electrodes are influenced by a touch based on the receiving signal as influenced electrodes, during a first sensing mode. The readout circuit adjusts a passband of the noise filter based on the number of influenced electrodes and transmits a transmitting signal to the influenced electrodes, during a second sensing mode. In an embodiment, the touch sensor operates in a self-capacitive manner during the first sensing mode and operates in a mutual-capacitive manner during the second sensing mode.

BRIEF DESCRIPTION OF THE FIGURES

The above and other objects and features of the present disclosure will become apparent by describing in detail embodiments thereof with reference to the accompanying drawings.

DETAILED DESCRIPTION OF EXEMPLARY EMBODIMENTS

Figure 1:
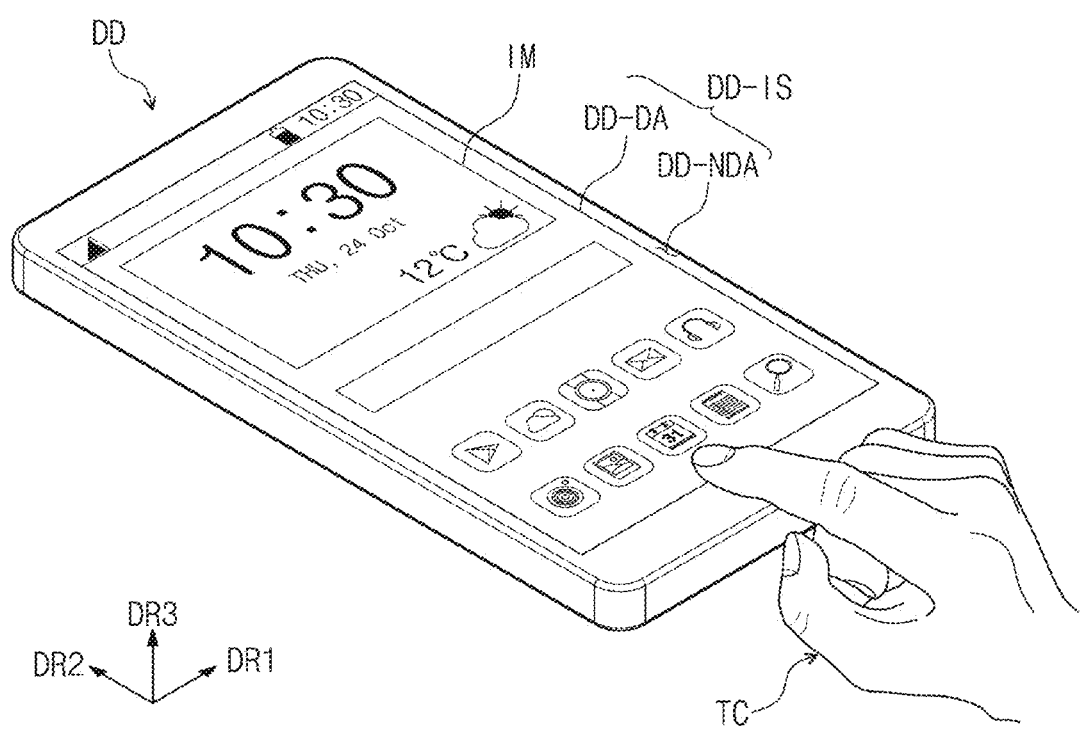
FIG. 1 is a perspective view illustrating a display device according to an embodiment of the present disclosure.

In the specification, when one component (or area, layer, part, or the like) is referred to as being "on", "connected to", or "coupled to" another component, it should be understood that the former may be directly on, connected to, or coupled to the latter, and also may be on, connected to, or coupled to the latter via a third intervening component.

Like reference numerals refer to like components. Also, in drawings, the thickness, ratio, and dimension of components are exaggerated for effectiveness of description of technical contents. The term "and/or" includes one or more combinations of the associated listed items.

The terms "first", "second", etc. are used to describe various components, but the components are not limited by the terms. The terms are used only to differentiate one component from another component. For example, a first component may be named as a second component, and vice versa, without departing from the spirit or scope of the present disclosure. A singular form, unless otherwise stated, includes a plural form.

Also, the terms "under", "beneath", "on", "above" are used to describe a relationship between components illustrated in a drawing. The terms are relative and are described with reference to a direction indicated in the drawing.

It will be understood that the terms "include", "comprise", "have", etc. specify the presence of features, numbers, steps, operations, elements, or components, described in the specification, or a combination thereof, not precluding the presence or additional possibility of one or more other features, numbers, steps, operations, elements, or components or a combination thereof.

Hereinafter, embodiments of the present disclosure will be described with reference to accompanying drawings.

FIG. 1 is a perspective view illustrating a display device DD, according to an embodiment of the present disclosure.

As illustrated in FIG. 1, the display device DD may display an image IM through a display surface DD-IS. The display surface DD-IS is parallel to a surface that is defined by a first direction axis DR1 and a second direction axis DR2. A third direction axis DR3 indicates the normal direction of the display surface DD-IS, that is, a thickness direction of the display device DD.

A front surface (or an upper surface) and a back surface (or a lower surface) of each of the components or members described below are divided by the third direction axis DR3. However, the first to third direction axes DR1, DR2, and DR3 illustrated in the present embodiment are merely examples. Hereinafter, first to third directions that are directions respectively indicated by the first, second, and third direction axes DR1, DR2, and DR3 are marked by the same reference symbols.

Although the display device DD having a planar display surface is illustrated in an embodiment of the present disclosure, the present disclosure is not limited thereto. The display device DD may further include a curved display surface. The display device DD may include a three-dimensional display surface. The three-dimensional display surface may include a plurality of display areas pointing in different directions, and may include, for example, a polygonal columnar display surface.

The display device DD according to an embodiment of the present disclosure may be a rigid display device. However, the present disclosure is not limited thereto, and the display device DD according to the present disclosure may be a flexible display device. The flexible display device may include a foldable display device, a bendable display device in which a partial area is bent, or a slidable display device.

In the present embodiment, FIG. 1 illustrates a display device DD applicable to a mobile phone terminal. Although not illustrated, electronic modules, camera modules, power modules, etc. mounted on a main board are disposed together with the display device DD in a bracket/case, etc., thereby configuring the mobile phone terminal. The display device DD according to the present disclosure may be applied to a small and medium-sized electronic device, such as a tablet, a vehicle navigation system, a game console, a smart watch, etc., as well as a large-sized electronic device, such as a television or a monitor, etc.

As illustrated in FIG. 1, the display surface DD-IS includes an image area DD-DA on which the image IM is displayed and a bezel area DD-NDA adjacent to the image area DD-DA. The bezel area DD-NDA is an area where an image is not displayed. Clock and icon images are illustrated in FIG. 1 as an example of the image IM.

As illustrated in FIG. 1, the image area DD-DA may have a substantially rectangular shape. The term "actually rectangular shape" includes not only a rectangular shape in a mathematical sense, but also a rectangular shape in which a vertex is not defined in a vertex region (or a corner region) and a boundary of a curve is defined.

The bezel area DD-NDA may surround the image area DD-DA. However, the present disclosure is not limited thereto since the image area DD-DA and the bezel area DD-NDA may be designed to have different shapes. The bezel area DD-NDA may be disposed on only one side of the image area DD-DA. Depending on a combination of the display device DD and other components of the electronic device (not illustrated), the bezel area DD-NDA may not be exposed to the outside.

According to an embodiment of the present disclosure, the display device DD may sense a user input TC, which is applied from the outside. The display device DD may sense the user input TC by sensing a change in any one or a combination of reflected light, temperature, pressure, ultrasonic waves, and electromagnetics by the user input TC. In the present embodiment, it is assumed that the user input TC is a touch input by a user's hand applied to a front surface of the display device DD, but this is an example, and as described above, the user input TC may be provided in various forms. In addition, the display device DD may sense the user input TC, which is applied to the side surface or the back surface of the display device DD depending on the structures of the display device DD, and is not limited to any one embodiment.

According to an embodiment of the present disclosure, the display device DD may sense an input by an electronic pen. The electronic pen may be an input device using a tool, such as a stylus pen, an electronic pen, or an active pen.

Figure 2:
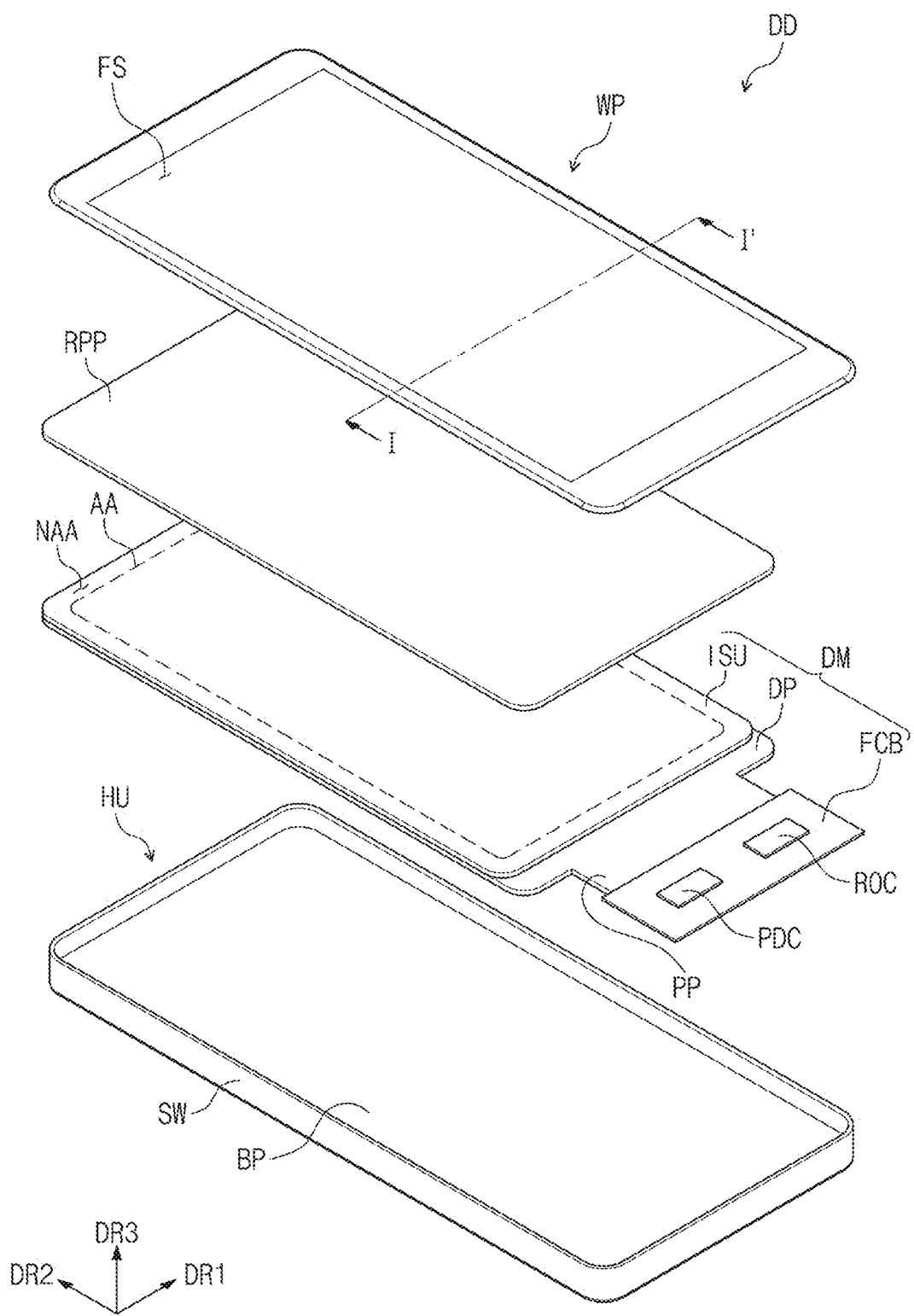
FIG. 2 is an exploded perspective view of a display device, according to an embodiment of the present disclosure.

FIG. 2 is an exploded perspective view of a display device, according to an embodiment of the present disclosure.

Referring to FIG. 2, the display device DD may include a window WP, an anti-reflection panel RPP, a display module DM, and a housing HU. As illustrated in FIGS. 1 and 2, in the present embodiment, the window WP and the housing HU are combined to form an exterior of the display device DD.

The window WP protects the upper surface of a display panel DP. The window WP may include an optically transparent insulating material. For example, the window WP may include a front surface FS including glass or plastic. The window WP may have a multi-layer or single-layer structure. For example, the window WP may include a plurality of plastic films bonded to each other by an adhesive or may include a glass substrate and a plastic film bonded to each other by an adhesive.

The anti-reflection panel RPP may be disposed under the window WP. The anti-reflection panel RPP reduces the reflectance of external light incident from the upper side of the window WP. In an embodiment of the present disclosure, the anti-reflection panel RPP may be omitted or may be embedded in the display module DM.

The display module DM may display the image IM and sense an external input. The display module DM may include the display panel DP, an input sensor ISU, and a printed circuit board FCB.

An active area AA and a peripheral area NAA corresponding to the image area DD-DA and the bezel area DD-NDA illustrated in FIG. 1 may be defined in the display module DM. The display panel DP may be configured to actually generate the image IM. The image IM generated by the active area AA of the display panel DP is recognized by a user at the outside through the window WP. The display panel DP may include a pad area PP. The pad area PP may be a portion of the peripheral area NAA.

The input sensor ISU may sense an external input applied from the outside. As described above, the input sensor ISU may sense an external input provided to the window WP.

The display panel DP may be electrically connected to the printed circuit board FCB. In an embodiment, a driving chip that generates signals necessary for an operation of the display panel DP may be mounted on the display panel DP.

The printed circuit board FCB may include various driving circuits for driving the display panel DP and the input sensor ISU or a connector for supplying power. In an embodiment, the printed circuit board FCB may include a panel driving circuit PDC for driving the display panel DP and a readout circuit ROC for driving the input sensor ISU. Each of the panel driving circuit PDC and the readout circuit ROC may be formed as an integrated circuit and mounted on the printed circuit board FCB. In another embodiment, the panel driving circuit PDC and the readout circuit ROC may be configured as one integrated circuit.

The housing HU includes a bottom part BP and a side wall SW. The side wall SW may extend from the bottom part BP. The housing HU may accommodate the display panel DP in an accommodating space defined by the bottom part BP and the side wall SW. The window WP may be coupled to the side wall SW of the housing HU. The side wall SW of the housing may support the edge of the window WP.

The housing HU may include a material having a relatively high rigidity. For example, the housing HU may include a plurality of frames and/or plates made of glass, plastic, metal, or a combination thereof. The housing HU may stably protect the components of the display device DD accommodated in the internal space from external impact.

Figure 3:
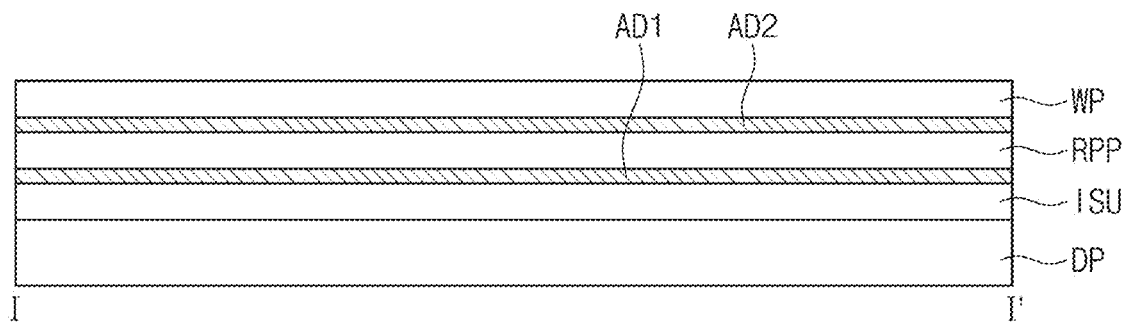
FIG. 3 is a cross-sectional view taken along a cutting line I-I' illustrated in FIG. 2.
Figure 3:
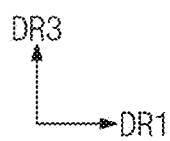

FIG. 3 is a cross-sectional view taken along a cutting line I-I' illustrated in FIG. 2.

FIG. 3 illustrates a cross section of the display device DD defined by the first direction axis DR1 and the third direction axis DR3. In FIG. 3, the components of the display device DD are simply illustrated in order to explain their stacking relationship.

The display device DD according to an embodiment of the present disclosure may include the display panel DP, the input sensor ISU, the anti-reflection panel RPP, and the window WP. At least some components of the display panel DP, the input sensor ISU, the anti-reflection panel RPP, and the window WP are formed by a continuous process. At least some components may be coupled to one another through an adhesive member. For example, the input sensor ISU and the anti-reflection panel RPP may be coupled to each other by an adhesive member AD1. The anti-reflection panel RPP and the window WP may be coupled by an adhesive member AD2.

The adhesive members AD1 and AD2 are transparent adhesive members such as a pressure sensitive adhesive film (PSA), an optically clear adhesive film (OCA), or an optically clear adhesive resin (OCR). The adhesive member described below may include a typical adhesive or a sticking agent. In an embodiment of the present disclosure, the anti-reflection panel RPP and the window WP may be replaced with other components or may be omitted.

In FIG. 3, the input sensor ISU formed through a continuous process with the display panel DP among the input sensor ISU, the anti-reflection panel RPP, and the window WP is directly disposed on the display panel DP. In this specification, "component B is disposed directly on component A" means that a separate adhesive layer/adhesive member is not disposed between the component "A" and the component "B". The component "B" is formed through a continuous process on the base surface provided by the component "A" after the component "A" is formed.

In one embodiment, the anti-reflection panel RPP and the window WP are provided in a "panel" type, and the input sensor ISU is provided in a "layer" type. The "panel" type includes a base layer providing a base surface, such as a synthetic resin film, a composite material film, a glass substrate, etc., whereas the "layer" type may omit the base layer. In other words, components of the "layer" type are disposed on the base surface provided by another component. In an embodiment, the anti-reflection panel RPP and the window WP may be of the "layer" type.

The display panel DP generates an image, and the input sensor ISU acquires coordinate information of an external input (e.g., a touch event). Although not illustrated separately, the display device DD according to an embodiment of the present disclosure may further include a protection member disposed on the lower surface (or a back surface) of the display panel DP. The protection member and the display panel DP may be coupled through an adhesive member.

The display panel DP according to an embodiment of the present disclosure may be a light emitting display panel, but is not particularly limited thereto. For example, the display panel DP may be an organic light emitting display panel or a quantum dot light emitting display panel. The panels are distinguished according to the constituent materials of the light emitting device. An emission layer of the organic light emitting display panel may include an organic light emitting material. An emission layer of the quantum dot light emitting display panel may include a quantum dot and/or a quantum rod, etc. Hereinafter, it is described that the display panel DP is an organic light emitting display panel.

The anti-reflection panel RPP reduces the reflectance of external light incident from the upper side of the window WP. The anti-reflection panel RPP according to an embodiment of the present disclosure may include a retarder and a polarizer. The retarder may be provided in a film type or a liquid crystal coating type. The polarizer may also be provided in a film type or a liquid coating type. The film type may include a stretch-type synthetic resin film, and the liquid crystal coating type may include liquid crystals arranged in a given direction. Each of the retarder and the polarizer may further include a protective film. The retarder and the polarizer itself or the protective film may be defined as the base layer of the anti-reflection panel RPP.

The anti-reflection panel RPP according to an embodiment of the present disclosure may be color filters. The color filters have a predetermined arrangement. An arrangement of color filters may be determined in consideration of emission colors of pixels included in the display panel DP. The anti-reflection panel RPP may further include a black matrix adjacent to the color filters.

The anti-reflection panel RPP according to an embodiment of the present disclosure may be a destructive interference structure. For example, the destructive interference structure may include a first reflective layer and a second reflective layer disposed on different layers. The first reflected light and the second reflected light reflected from the first reflective layer and the second reflective layer, respectively, may destructively interfere, and thus external light reflectance is reduced.

The window WP according to an embodiment of the present disclosure may include a glass substrate and/or a synthetic resin film. The window WP is not limited to a single layer. The window WP may include two or more films coupled by an adhesive member. Although not illustrated separately, the window WP may further include a functional coating layer. The functional coating layer may include an anti-fingerprint layer, an anti-reflection layer, and a hard coating layer.

Figure 4:
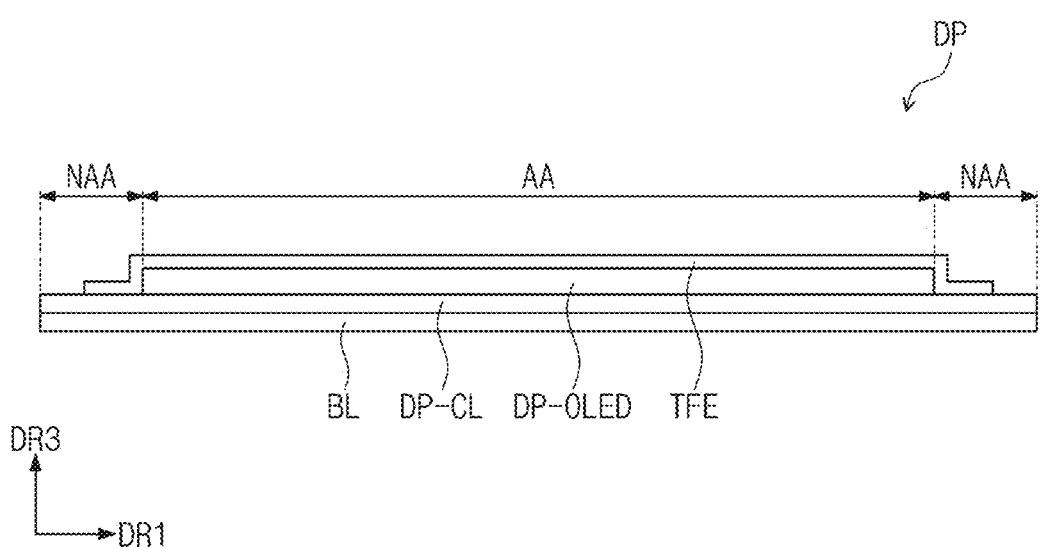
FIG. 4 is a cross-sectional view of a display panel illustrated in FIG. 3.

FIG. 4 is a cross-sectional view of the display panel DP illustrated in FIG. 3.

As illustrated in FIG. 4, the display panel DP includes a base layer BL, a circuit element layer DP-CL disposed on the base layer BL, a light emitting element layer DP-OLED, and a thin film encapsulation layer TFE. The active area AA and the peripheral area NAA corresponding to the image area DD-DA and the bezel area DD-NDA illustrated in FIG. 1 may be defined in the display panel DP. In this specification, "a region/portion corresponds to a region/portion" means "overlapping each other", but is not limited to having the same area and/or the same shape.

The base layer BL may include at least one synthetic resin film. The base layer BL may include a glass substrate, a metal substrate, or an organic/inorganic composite material substrate.

The circuit element layer DP-CL is disposed on the base layer BL. The circuit element layer DP-CL may include at least one insulating layer and circuit elements. The insulating layer may include at least one inorganic layer and at least one organic layer. The circuit elements may include signal lines and a pixel driving circuit.

The light emitting element layer DP-OLED is disposed on the circuit element layer DP-CL. The light emitting element layer DP-OLED may include organic light emitting diodes. The light emitting element layer DP-OLED may further include an organic layer such as a pixel defining layer.

The thin film encapsulation layer TFE may be disposed on the light emitting element layer DP-OLED to encapsulate the light emitting element layer DP-OLED. The thin film encapsulation layer TFE may entirely cover the active area AA. The thin film encapsulation layer TFE may cover a portion of the peripheral area NAA.

The thin film encapsulation layer TFE includes a plurality of thin films. Some of the thin films may be disposed to increase optical efficiency, and some of the thin films may be disposed to protect organic light emitting diodes.

Figure 5:
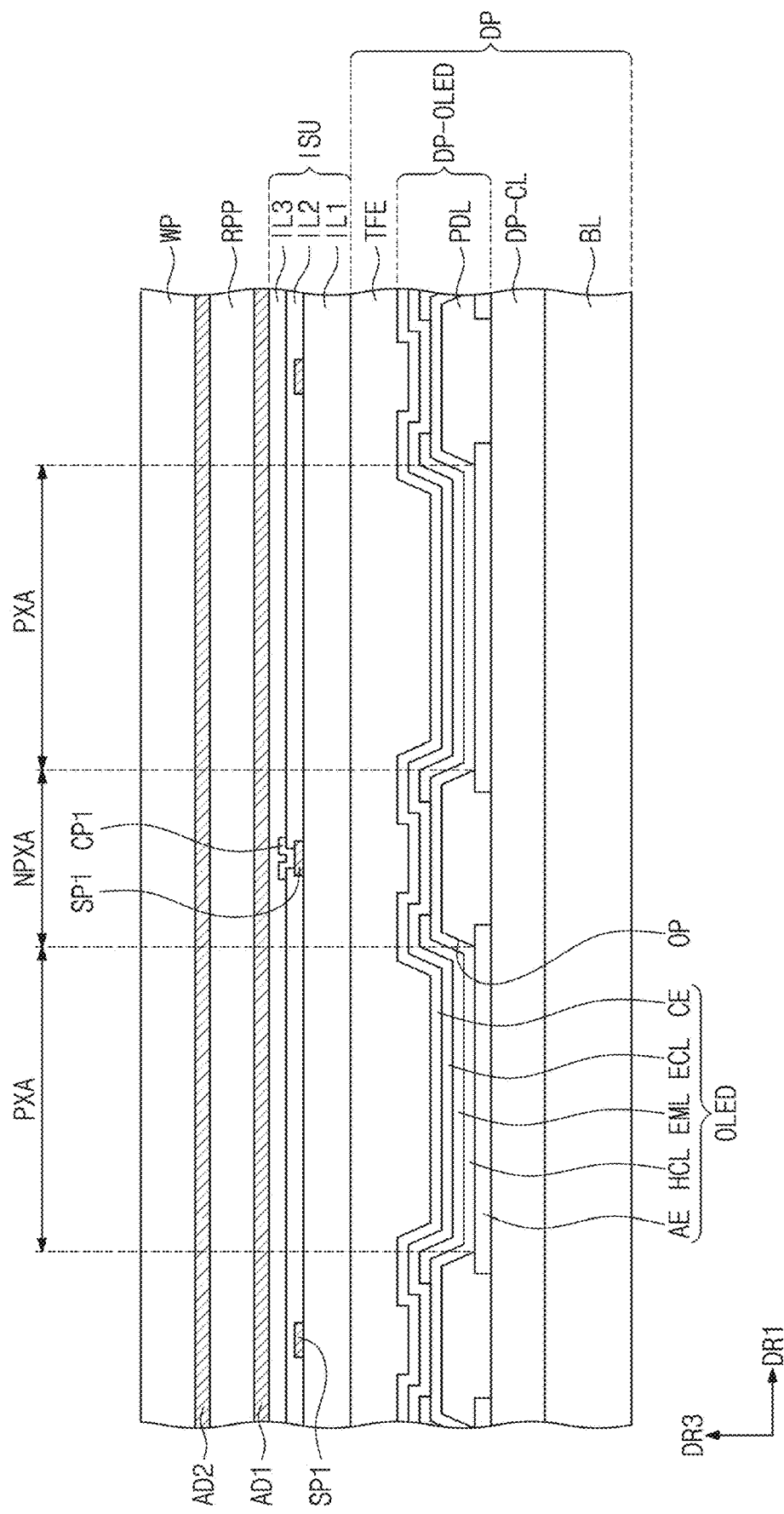
FIG. 5 is a cross-sectional view of a display device specifically illustrating a light emitting element layer and an input sensor.

FIG. 5 is a cross-sectional view of a display device specifically illustrating a light emitting element layer and an input sensor.

As illustrated in FIG. 5, the display panel DP includes the base layer BL, the circuit element layer DP-CL disposed on the base layer BL, the light emitting element layer DP-OLED, and the thin film encapsulation layer TFE. Although not illustrated separately, the display panel DP may further include functional layers such as an anti-reflection layer and a refractive index adjusting layer.

The base layer BL may include a synthetic resin film. A synthetic resin layer is formed on a working substrate used in manufacturing the display panel DP. Thereafter, a conductive layer and an insulating layer are formed on the synthetic resin layer. When the working substrate is removed, the synthetic resin layer corresponds to the base layer BL. The synthetic resin layer may be a polyimide-based resin layer, but the material of the synthetic resin layer is not specifically limited thereto. In addition, the base layer BL may include a glass substrate, a metal substrate, or an organic/inorganic composite material substrate.

The circuit element layer DP-CL may include at least one insulating layer and a circuit element. Hereinafter, the insulating layer included in the circuit element layer DP-CL is referred to as an intermediate insulating layer. The intermediate insulating layer may include at least one intermediate inorganic layer and at least one intermediate organic layer. The circuit element includes a signal line, a pixel driving circuit, etc. The circuit element layer DP-CL may be formed through a process of forming an insulating layer, a semiconductor layer, and a conductive layer by coating, deposition, or the like, and a process of patterning the insulating layer, the semiconductor layer, and the conductive layer by a photolithography process.

The light emitting element layer DP-OLED may include a pixel defining layer PDL and an organic light emitting diode OLED. The pixel defining layer PDL may include an organic material. The first electrode AE is disposed on the circuit element layer DP-CL. The pixel defining layer PDL is formed on the first electrode AE. An opening OP is defined in the pixel defining layer PDL. The opening OP of the pixel defining layer PDL exposes at least a portion of the first electrode AE. In an embodiment of the present disclosure, the pixel defining layer PDL may be omitted.

A hole control layer HCL may be disposed on the first electrode AE. A light emitting layer EML is disposed on the hole control layer HCL. The light emitting layer EML may be disposed in an area corresponding to the opening OP. In detail, the light emitting layer EML may be separately formed for each of pixels PX (refer to FIG. 6). The light emitting layer EML may include an organic material and/or an inorganic material. The light emitting layer EML may generate a predetermined color light.

An electronic control layer ECL is disposed on the light emitting layer EML. A second electrode CE is disposed on the electronic control layer ECL. The second electrode CE is disposed in the pixels PX in common.

The thin film encapsulation layer TFE is disposed on the second electrode CE.

The thin film encapsulation layer TFE seals the light emitting element layer DP-OLED. The thin film encapsulation layer TFE includes at least one insulating layer. The thin film encapsulation layer TFE according to an embodiment of the present disclosure may include at least one inorganic layer (hereinafter, referred to as an encapsulation inorganic layer). The thin film encapsulation layer TFE according to an embodiment of the present disclosure may include at least one organic layer (hereinafter, referred to as an encapsulation organic layer) and at least one encapsulation inorganic layer.

The encapsulation inorganic layer protects the light emitting element layer DP-OLED from moisture/oxygen, and the encapsulation organic layer protects the light emitting element layer DP-OLED from a foreign material such as a dust particle. The encapsulation inorganic layer may include a silicon nitride layer, a silicon oxynitride layer, a silicon oxide layer, a titanium oxide layer, or an aluminum oxide layer, but is not particularly limited thereto. The encapsulation organic layer may include, but is not limited to, an acrylic-based organic layer.

The input sensor ISU includes a base layer IL1, first and second conductive layers disposed thereon, and first and second insulating layers IL2 and IL3. The base layer IL1 may include an inorganic material, for example, a silicon nitride layer. The inorganic layer disposed on the uppermost side of the thin film encapsulation layer TFE may also include silicon nitride, and the silicon nitride layer and the base layer IL1 of the thin film encapsulation layer TFE may be formed under different deposition conditions.

The first conductive layer is disposed on the base layer IL1. The first conductive layer may include a first sensing pattern SP1, a second sensing pattern SP2, and a second connection pattern CP2 (refer to FIG. 7A). The second conductive layer is disposed on the first conductive layer. The second conductive layer may include a first connection pattern CP1. The first insulating layer IL2 is disposed between the first conductive layer and the second conductive layer. The first insulating layer IL2 spaces and separates the first conductive layer from the second conductive layer in cross-section. A contact hole for partially exposing the first sensing pattern SP1 may be provided in the first insulating layer IL2, and the first connection pattern CP1 may be connected to the first sensing pattern SP1 through the contact hole. The second insulating layer IL3 is disposed on the first insulating layer IL2. The second insulating layer IL3 may cover the second conductive layer. The second insulating layer IL3 protects the second conductive layer from an external environment.

Mesh lines of the first sensing pattern SP1 and the second sensing pattern SP2 may define a plurality of mesh holes. The mesh lines may have a three-layer structure of titanium/aluminum/titanium.

In the display device according to an embodiment of the present disclosure, the input sensor ISU may be directly disposed on the display panel DP. In this specification, being directly disposed means that the adhesive film is not disposed between the input sensor ISU and the display panel DP. In detail, the input sensor ISU may be formed on the display panel DP by a sequential process. In an embodiment, the display panel DP may be expressed as a display layer, and the input sensor ISU may be expressed as an input sensing layer.

A portion where the first electrode AE and the light emitting layer EML are disposed may be referred to as a pixel area PXA. The pixel area PXA may be disposed to be spaced apart from each other in each of the first direction DR1 and the second direction DR2 (refer to FIG. 1). A non-pixel area NPAX is disposed between the pixel areas PXA and may surround the pixel area PXA.

The anti-reflection panel RPP may be disposed on the upper surface of the input sensor ISU. As an example of the present disclosure, the anti-reflection panel RPP may include a polarizing film. The anti-reflection panel RPP may further include a protective film and other functional films in addition to the polarizing film, but hereinafter, only the polarizing film is illustrated for convenience of description. The adhesive member AD1 may be disposed between the anti-reflection panel RPP and the input sensor ISU. Accordingly, the anti-reflection panel RPP may be coupled to the input sensor ISU by the adhesive member AD1. The window WP may be coupled to the anti-reflection panel RPP through the adhesive member AD2.

The display panel DP and the input sensor ISU will be described in detail below.

Figure 6:
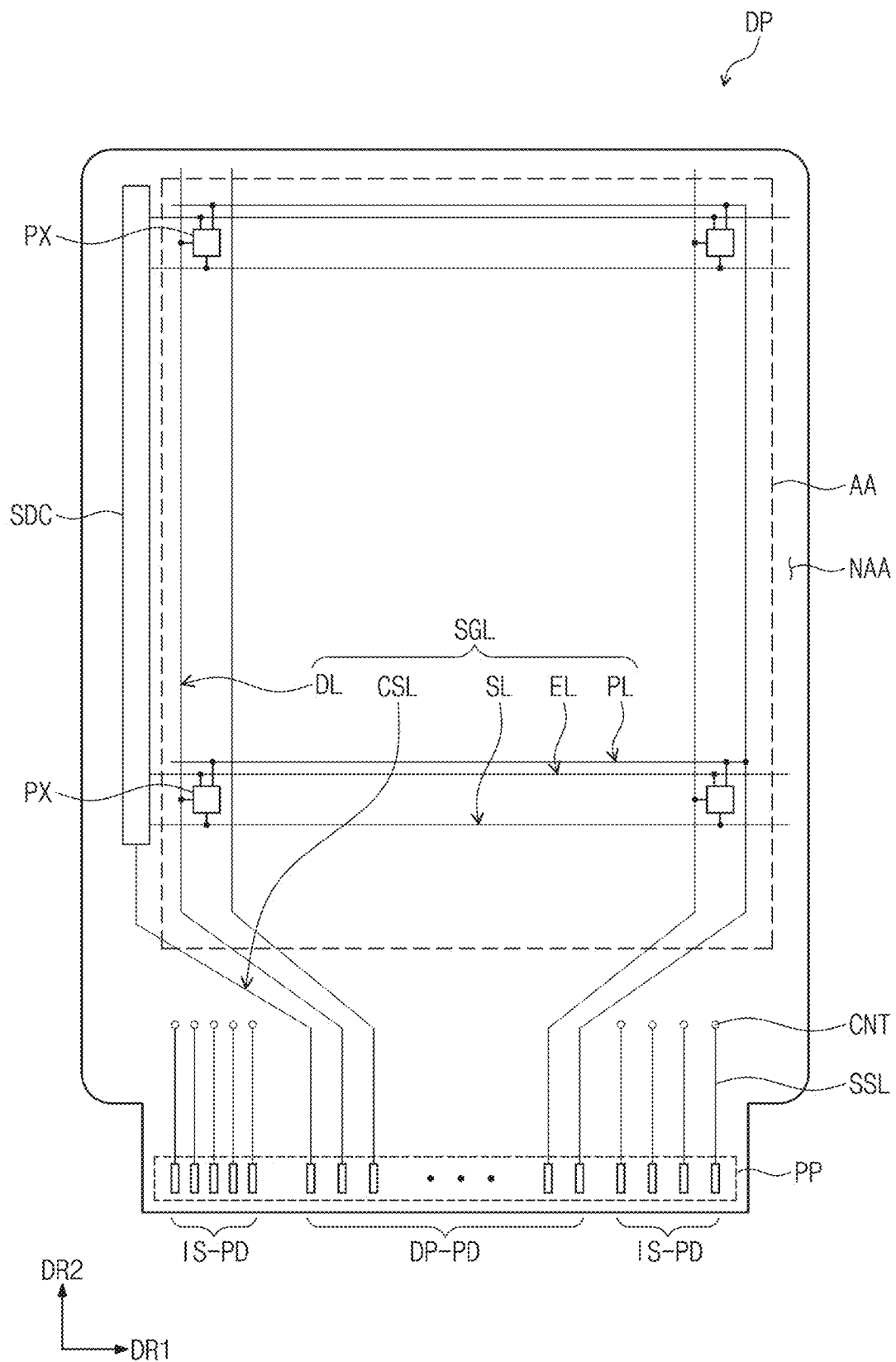
FIG. 6 is a plan view of a display panel according to an embodiment of the present disclosure.

FIG. 6 is a plan view of the display panel DP, according to an embodiment of the present disclosure.

Referring to FIG. 6, the display panel DP may include a scan driving circuit SDC, a plurality of signal lines SGL (hereinafter, referred to as signal lines), a plurality of signal pads DP-PD and IS-PD (hereinafter, referred to as signal pads), and a plurality of pixels PX (hereinafter, referred to as pixels).

The scan driving circuit SDC generates a plurality of scan signals (hereinafter, referred to as scan signals) and sequentially outputs the scan signals to a plurality of scan lines SL (hereinafter, referred to as scan lines) to be described later. The scan driving circuit SDC may sequentially output not only the scan signals but also light emission control signals to a plurality of light emission control lines EL (hereinafter referred to as light emission control lines) to be described later. In an embodiment, the light emission control signals are not output from the scan driving circuit SDC, but may be output from a separate circuit (e.g., a light emission driving circuit).

The scan driving circuit SDC may include a plurality of transistors formed through the same process as transistors in the pixels PX.

The signal lines SGL include scan lines SL, data lines DL, a power line PL, emission control lines EL, and a control signal line CSL. Each of the scan lines SL, data lines DL, and emission control lines EL is connected to a corresponding pixel PX among the pixels PX. The power line PL is commonly connected to the pixels PX. The control signal line CSL may provide control signals to the scan driving circuit SDC. The power line PL may provide a voltage necessary for the operation of the pixels PX. The power line PL may include a plurality of lines providing different voltages.

In this embodiment, the signal lines SGL may further include auxiliary lines SSL. In an embodiment of the present disclosure, the auxiliary lines SSL may be omitted. The auxiliary lines SSL are respectively connected to contact holes CNT. The auxiliary lines SSL may be electrically connected to signal lines of an input sensor ISU (refer to FIG. 7) to be described later through the contact holes CNT.

The display panel DP may include the pad area PP. A plurality of signal pads DP-PD and IS-PD may be disposed in the pad area PP of the display panel DP. The signal pads DP-PD and IS-PD may include first type signal pads DP-PD connected to the data lines DL, the power line PL, and the control signal line CSL, and second type signal pads IS-PD connected to the auxiliary lines SSL. The first type signal pads DP-PD and the second type signal pads IS-PD are disposed adjacent to each other in the pad area PP defined in a partial area of the peripheral area NAA. The stacked structure or constituent materials of the signal pads DP-PD and IS-PD may be formed through the same process.

The active area AA may be defined as an area in which the pixels PX are disposed. A plurality of electronic devices are disposed in the active area AA. The electronic devices include an organic light emitting diode provided in each of the pixels PX and a pixel driving circuit connected thereto. The scan driving circuit SDC, the signal lines SGL, the signal pads DP-PD and IS-PD, and the pixel driving circuit may be included in the circuit element layer DP-CL illustrated in FIG. 4.

Although not illustrated in the drawing, each of the pixels PX may include a plurality of transistors, a capacitor, and an organic light emitting diode. The pixels PX emit light in response to signals received through the scan lines SL, the data lines DL, the emission control lines EL, and the power line PL.

The signal pads DP-PD and IS-PD of the display panel DP may be electrically connected to the printed circuit board FCB illustrated in FIG. 2.

A portion of the display panel DP illustrated in FIG. 6 may be bent. A portion of the peripheral area NAA of the display panel DP may be bent based on a bending axis parallel to the first direction DR1. The bending axis may be defined to overlap a portion of the data lines DL and a portion of the auxiliary lines SSL.

Figure 7:
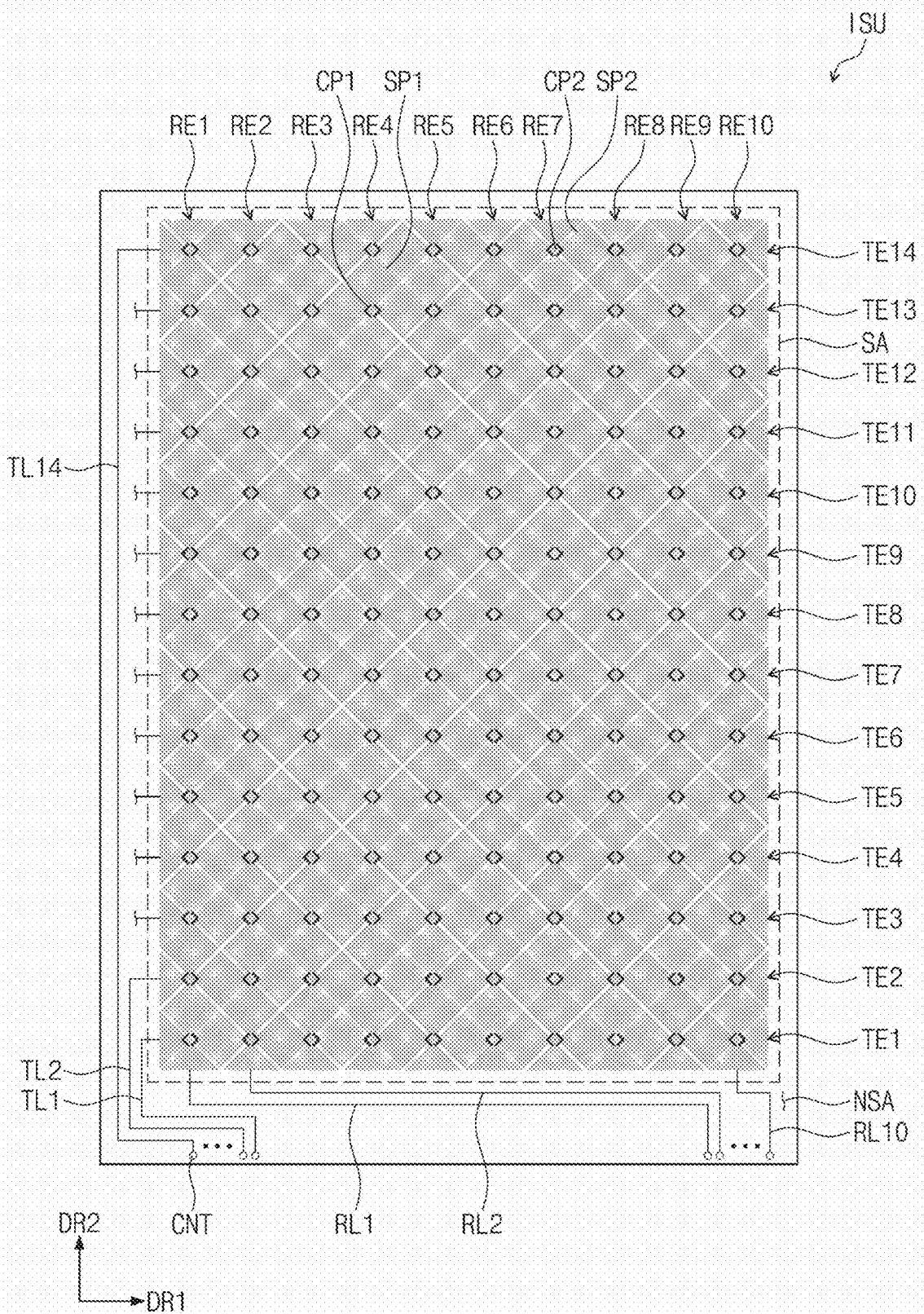
FIG. 7 is a plan view illustrating a configuration of an input sensor, according to an embodiment of the present disclosure.

FIG. 7 is a plan view illustrating a configuration of the input sensor ISU, according to an embodiment of the present disclosure.

Referring to FIG. 7, the input sensor ISU may include a sensing area SA and a non-sensing area NSA. The sensing area SA may be an area that is activated according to an electrical signal. For example, the sensing area SA may be an area to sense an input. The non-sensing area NSA may surround the sensing area SA. The sensing area SA may correspond to the active area AA of FIG. 5, and the non-sensing area NSA may correspond to the peripheral area NAA of FIG. 5.

The input sensor ISU includes first to fourteenth transmitting electrodes TE1 to TE14 (or first sensing electrodes) and first to tenth receiving electrodes RE1 to RE10 (or second sensing electrodes). The first to fourteenth transmitting electrodes TE1 to TE14 and the first to tenth receiving electrodes RE1 to RE10 are disposed in the sensing area SA. The first to fourteenth transmitting electrodes TE1 to TE14 and the first to tenth receiving electrodes RE1 to RE10 are electrically insulated from each other and cross each other in the sensing area SA. As an example of the present disclosure, the input sensor ISU includes 14 transmitting electrodes TE1 to TE14 and 10 receiving electrodes RE1 to RE10, but the present disclosure is not limited thereto. The number of each of the transmitting electrodes and the receiving electrodes may be variously changed. Although it is illustrated in FIG. 7 that the number of transmitting electrodes is greater than the number of receiving electrodes, in another embodiment, the number of transmitting electrodes may be greater than or equal to the number of receiving electrodes.

In this specification, to clearly distinguish the first to fourteenth electrodes TE1 to TE14 and the first to tenth electrodes RE1 to RE10, although the electrodes TE1 to TE14 are named transmitting electrodes and the electrodes RE1 to RE10 are named receiving electrodes, the functions of the electrodes of the present disclosure are not limited to these names. According to operation modes, the transmitting electrodes TE1 to TE14 may operate not only as transmitting electrodes but also as receiving electrodes, and the receiving electrodes RE1 to RE10 may operate as transmitting electrodes as well as receiving electrodes.

Each of the first to tenth receiving electrodes RE1 to RE10 extends in the second direction DR2. The first to tenth receiving electrodes RE1 to RE10 may be arranged to be spaced apart from each other in the first direction DR1. The first to tenth receiving electrodes RE1 to RE10 may be electrically isolated from each other. The first to tenth receiving electrodes RE1 to RE10 may be disposed to cross each other with the first to fourteenth transmitting electrodes TE1 to TE14 and may be electrically insulated. Each of the first to tenth receiving electrodes RE1 to RE10 includes first sensing patterns SP1 and first connection patterns CP1. The first connection patterns CP1 electrically connect the first sensing patterns SP1 spaced apart from each other in the second direction DR2. In an embodiment, the first sensing patterns SP1 and the first connection patterns CP1 are disposed on different layers and do not have an integral shape.

Each of the first to fourteenth transmitting electrodes TE1 to TE14 extends in the first direction DR1. The first to fourteenth transmitting electrodes TE1 to TE14 may be arranged to be spaced apart from each other in the second direction DR2. The first to fourteenth transmitting electrodes TE1 to TE14 may be electrically isolated from each other. Each of the first to fourteenth transmitting electrodes TE1 to TE14 includes second sensing patterns SP2 and second connection patterns CP2. The second connection patterns CP2 electrically connect the first sensing patterns SP1 spaced apart from each other in the first direction DR1. In an embodiment, the second sensing patterns SP2 and the second connection patterns CP2 have an integral shape. In an embodiment, the second sensing patterns SP2 and the second connection patterns CP2 are disposed on a same layer.

Although FIG. 7 illustrates the first sensing patterns SP1 and the second sensing patterns SP2 having a rhombus shape, the present disclosure is not limited thereto. The first sensing patterns SP1 and the second sensing patterns SP2 may have various shapes.

Each of the first to fourteenth transmitting electrodes TE1 to TE14 and the first to tenth receiving electrodes RE1 to RE10 may have a mesh shape. When each of the first to fourteenth transmitting electrodes TE1 to TE14 and the first to tenth receiving electrodes RE1 to RE10 has the mesh shape, parasitic capacitance associated with electrodes (e.g., second electrode CE, (refer to FIG. 5)) of the display panel DP (refer to FIG. 5) may be reduced.

The input sensor ISU may further include first to fourteenth transmitting lines TL1 to TL14 (or first sensing lines) and first to tenth receiving lines R11 to RL10 (or second sensing lines). The first to fourteenth transmitting lines TL1 to TL14 and the first to tenth receiving lines RL1 to RL10 may be disposed in the non-sensing area NSA. The first to fourteenth transmitting lines TL1 to TL14 are electrically connected to one side of the first to fourteenth transmitting electrodes TE1 to TE14, and the first to tenth receiving lines RL1 to RL10 are electrically connected to one side of the first to tenth receiving electrodes RE1 to RE10. However, the present disclosure is not limited thereto. As an example of the present disclosure, the input sensor ISU may further include receiving lines electrically connected to the other side of the first to tenth receiving electrodes RE1 to RE10.

One end of the first to fourteenth transmitting lines TL1 to TL14 and one end of the first to tenth receiving lines RL1 to RL10 are electrically connected to the auxiliary lines SSL illustrated in FIG. 6 through the contact holes CNT.

The input sensor ISU is electrically connected to the readout circuit ROC (refer to FIG. 2) through the first to fourteenth transmitting lines TL1 to TL14 and the first to tenth receiving lines RL1 to RL10. The readout circuit ROC may control an operation of the input sensor ISU.

Figure 8A:
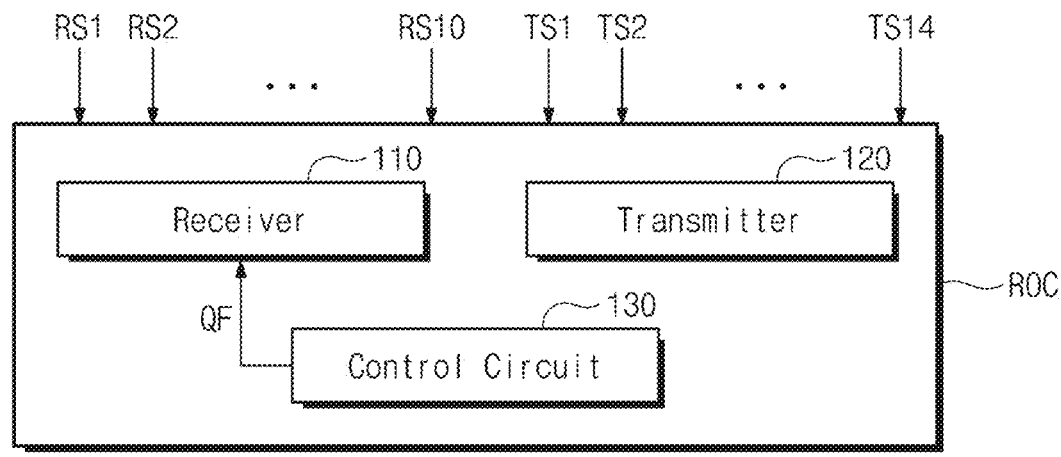
FIGS. 8A and 8B are block diagrams of a readout circuit, according to an embodiment of the present disclosure.
Figure 8B:
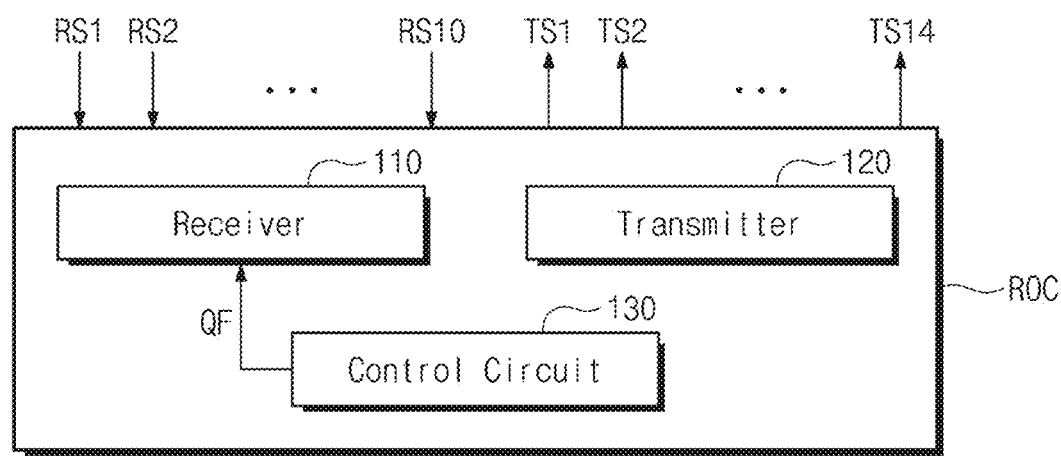

FIGS. 8A and 8B are block diagrams of a readout circuit, according to an embodiment of the present disclosure.

Referring to FIGS. 8A and 8B, the readout circuit ROC includes a receiver 110, a transmitter 120, and a control circuit 130.

FIG. 8A illustrates the readout circuit ROC in the first sensing mode, and FIG. 8B illustrates the readout circuit ROC in the second sensing mode.

The receiver 110 receives the first to fourteenth transmitting signals TS1 to TS14 from the first to fourteenth transmitting electrodes TE1 to TE14 illustrated in FIG. 7 and/or receives the first to tenth receiving signals RS1 to RS10 from the first to tenth receiving electrodes RE1 to RE10 illustrated in FIG. 7, and provides the control circuit 130 with a sensing signal.

The transmitter 120 provides the first to fourteenth transmitting signals TS1 to TS14 to the first to fourteenth transmitting electrodes TE1 to TE14 illustrated in FIG. 7.

The control circuit 130 controls the receiver 110 and the transmitter 120. The operations of the receiver 110, the transmitter 120, and the control circuit 130 will be described in detail below.

Referring to FIG. 8A, the readout circuit ROC may obtain position information associated with the user input TC through a change in capacitance of each of the first to fourteenth transmitting electrodes TE1 to TE14 and/or the first to tenth receiving electrodes RE1 to RE10 during the first sensing mode. The first sensing mode may be a self-capacitance (self-cap) sensing mode that senses a change in each of the first to fourteenth transmitting signals TS1 to TS14 and/or each of the first to tenth receiving signals RS1 to RS10.

During the first sensing mode, the control circuit 130 provides a Q factor signal QF to the receiver 110. The receiver 110 may include a noise filter (e.g., a band pass filter 112 of FIG. 10) to be described later. The receiver 110 may set a passband of the noise filter in response to the Q factor signal QF. During the first sensing mode, the Q factor signal QF may be set to a preset level. The preset level of the Q factor signal QF may be determined to be a level at which the first to fourteenth transmitting signals TS1 to TS14 may be stably received.

During the first sensing mode, the receiver 110 receives the first to fourteenth transmitting signals TS1 to TS14 from the first to fourteenth transmitting electrodes TE1 to TE14 and the first to tenth receiving signals RS1 to RS10 from the first to tenth receiving electrodes RE1 to RE10 in response to a control of the control circuit 130. The first to fourteenth transmitting signals TS1 to TS14 received from the first to fourteenth transmitting electrodes TE1 to TE14 and the first to tenth receiving signals RS1 to RS10 received from the first to tenth receiving electrodes RE1 to RE10 may be analog capacitance signals generated by the user input TC (refer to FIG. 1). The receiver 110 may include an analog front end (AFE) circuit for sensing the analog capacitance signals.

The receiver 110 provides a digital sensing signal corresponding to the sensed analog capacitance signals to the control circuit 130. The control circuit 130 determines the position of the user input TC (refer to FIG. 1) in response to the received signal from the receiver 110, and selects effective transmitting electrodes corresponding to the position of the user input TC (refer to FIG. 1) among the first to fourteenth transmitting electrodes TE1 to TE14. For example, the control circuit 130 may determine which of the transmitting electrodes have been influenced by a touch to be the effective transmitting electrodes. The effective transmitting nodes may also be referred to as influenced electrodes.

In an embodiment, the transmitter 120 does not operate during the first sensing mode. For example, the transmitter 120 does not transmit signals to the transmitting electrodes TE1 to TE14 during the first sensing mode.

Referring to FIG. 8B, the readout circuit ROC may obtain the position information associated with the user input TC through a change in mutual capacitance between effective transmitting electrodes (e.g., influenced electrodes) among the first to fourteenth transmitting electrodes TE1 to TE14 and first to tenth receiving electrodes RE1 to RE10 during the second sensing mode. The second sensing mode may be a mutual capacitance (mutual cap) sensing mode that senses a change in mutual capacitance between the first to fourteenth transmitting signals TS1 to TS14 and the first to tenth receiving signals RS1 to RS10.

During the second sensing mode, the control circuit 130 provides the Q factor signal QF to the receiver 110. The receiver 110 may set a passband of the noise filter in response to the Q factor signal QF. In the second sensing mode, the Q factor signal QF provided from the control circuit 130 to the receiver 110 may be determined depending on the number of effective transmitting electrodes among the first to fourteenth transmitting electrodes TE1 to TE14.

For example, as the number of effective transmitting electrodes among the first to fourteenth transmitting electrodes TE1 to TE14 decreases, the Q factor indicated by the Q factor signal QF increases. As the Q factor increases, the passband of the noise filter becomes narrower. That is, as the number of effective transmitting electrodes among the first to fourteenth transmitting electrodes TE1 to TE14 decreases, the passband of the noise filter becomes narrower. Accordingly, the noise removal performance of the noise filter may be increased.

During the second sensing mode, the transmitter 120 transmits transmitting signals to the effective transmitting electrodes among the first to fourteenth transmitting electrodes TE1 to TE14 in response to the control of the control circuit 130. The transmitting signals corresponding to the effective transmitting electrodes among the first to fourteenth transmitting signals TS1 to TS14 have a pulse signal form swinging between predetermined voltage levels, and transmitting signals corresponding to non-effective transmitting electrodes may be maintained at a uniform reference voltage level (e.g., a ground voltage level). In an embodiment, during the sensing mode, the transmitter 120 transmits first transmitting signals to the effective transmitting electrodes (e.g., electrodes influenced by a touch) that have the pulse form and transmits second transmitting signals having the uniform reference voltage level to the remaining transmitting electrodes.

The receiver 110 receives the first to tenth receiving signals RS1 to RS10 from the first to tenth receiving electrodes RE1 to RE10. The first to tenth receiving signals RS1 to RS10 received from the first to tenth receiving electrodes RE1 to RE10 may be analog capacitance signals generated by the user input TC (refer to FIG. 1).

The receiver 110 provides a digital sensing signal corresponding to the sensed analog capacitance signals to the control circuit 130. The control circuit 130 may determine the position of the user input TC (refer to FIG. 1) in response to the received signal from the receiver 110.

Figure 9:
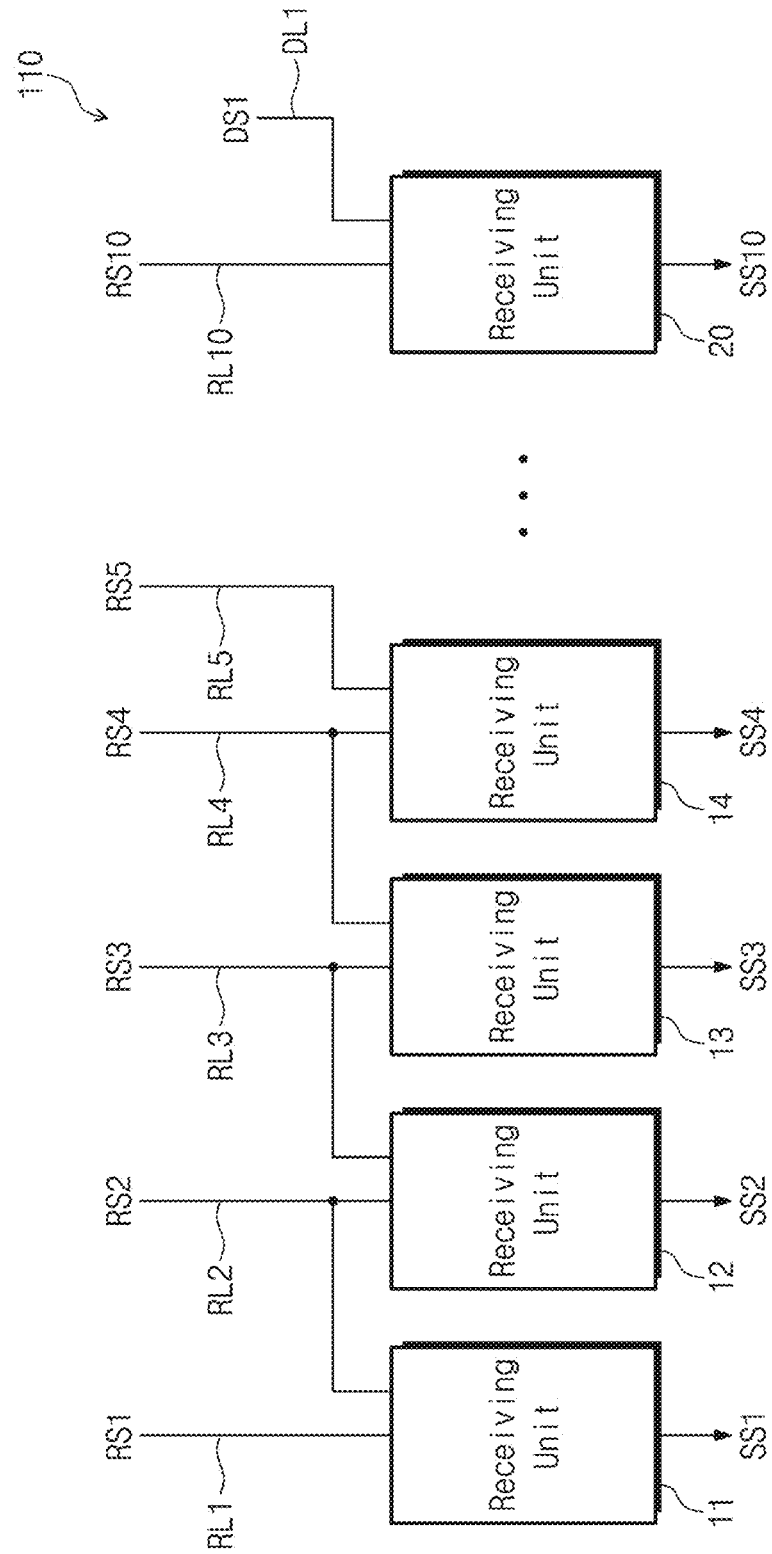
FIG. 9 is a block diagram of a receiver illustrated in FIGS. 8A and 8B.

FIG. 9 is a block diagram of a receiver illustrated in FIGS. 8A and 8B according to an embodiment of the disclosure.

Referring to FIG. 9, the receiver 110 illustrated in FIGS. 8A and 8B includes first to tenth receiving units 11 to 20 (e.g., receiving circuits) corresponding to the first to tenth receiving lines RL1 to RL10, respectively. The first receiving unit 11 is connected to the first receiving line RL1 and the second receiving line RL2. The second receiving unit 12 is connected to the second receiving line RL2 and the third receiving line RL3. The third receiving unit 13 is connected to the third receiving line RL3 and the fourth receiving line RL4. The fourth receiving unit 14 is connected to the fourth receiving line RL4 and the fifth receiving line RL5. The tenth receiving unit 20 is connected to the tenth receiving line RL10 and a dummy line DLL Each of the first to tenth receiving units 11 to 20 amplifies a difference between received signals received through two receiving lines and outputs sensing signals SS1 to SS10. Each of the first to tenth receiving units 11 to 20 may increase a signal-to-noise ratio (SNR) by amplifying the difference between received signals to remove noise and increasing signal components.

For example, the first receiving unit 11 outputs the sensing signal SS1 corresponding to a difference between the first receiving signal RS1 and the second receiving signal RS2. The second receiving unit 12 outputs the sensing signal SS2 corresponding to a difference between the second receiving signal RS2 and the third receiving signal RS3. The third receiving unit 13 outputs the sensing signal SS3 corresponding to a difference between the third receiving signal RS3 and the fourth receiving signal RS4. The fourth receiving unit 14 outputs the sensing signal SS4 corresponding to a difference between the fourth receiving signal RS4 and the fifth receiving signal RS5. The tenth receiving unit 20 outputs the sensing signal SS10 corresponding to a difference between the tenth receiving signal RS10 and the dummy receiving signal DS 1.

FIG. 9 illustrates only the first to tenth receiving units 11 to 20 respectively corresponding to the first to tenth receiving lines RL1 to RL10, but the receiver 110 may further include receiving units respectively corresponding to the first to fourteenth transmitting lines TL1 to TL14.

Figure 10:
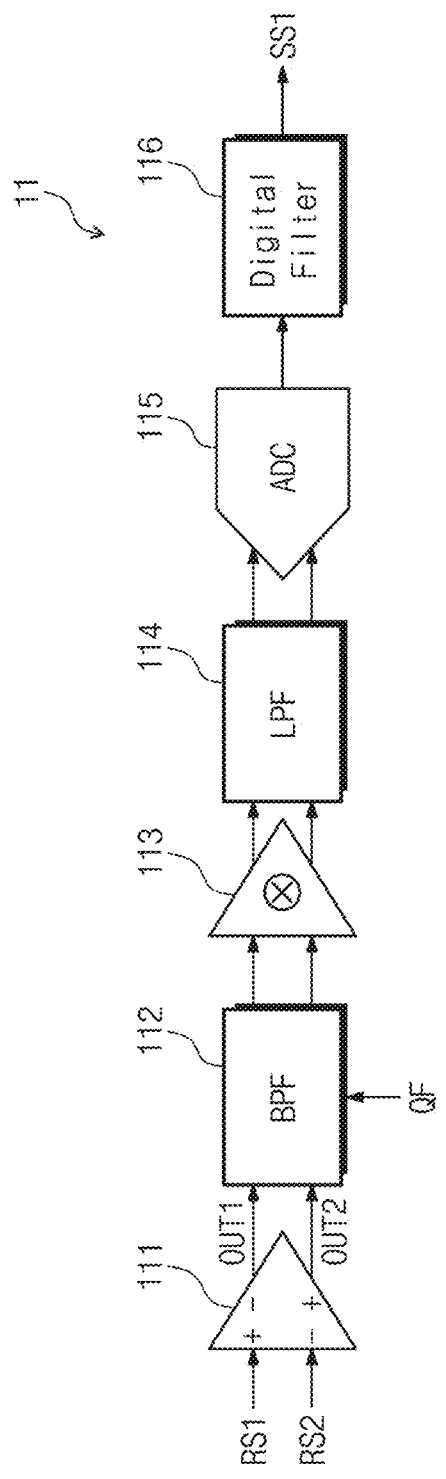
FIG. 10 is a block diagram of a receiving unit illustrated in FIG. 9.

FIG. 10 is a block diagram of the receiving unit 11 illustrated in FIG. 9 according to an embodiment of the disclosure.

Although only the receiving unit 11 illustrated in FIG. 9 is illustrated in FIG. 10, the second to tenth receiving units 12 to 20 may also include the same configuration as the receiving unit 11.

Referring to FIG. 10, the receiving unit 11 includes an amplifier 111, the band pass filter 112, a mixer 113, a low pass filter 114, an analog-to-digital converter 115, and a digital filter 116.

The amplifier 111 may be a differential amplifier or a pseudo differential amplifier. The amplifier 111 may receive the first receiving signal RS1 and the second receiving signal RS2, and may output a first output signal OUT1 and a second output signal OUT2.

The band pass filter 112 may be a noise filter that passes only signals of a specific frequency band of the first output signal OUT1 and the second output signal OUT2. The band pass filter 112 may change an internal resistance value and/or an internal capacitance depending on the Q factor signal QF. The passband of the band pass filter 112 may be changed by changing the internal resistance value and/or internal capacitance. For example, when the Q-factor of the Q factor signal QF or the level of a quality factor increases, the passband of the band pass filter 112 may be narrowed. Thus, the Q factor signal QF applied to the band pass filter 112 is used to adjust the passband of the band pass filter 112.

The output of the band pass filter 112 may be provided to the mixer 113. The mixer 113 converts the frequency of the signal received from the band pass filter 112. The low pass filter 114 passes only a signal corresponding to a frequency band less than or equal to a specific value among the signals received from the mixer 113 and provides the passed signal to the analog-to-digital converter 115.

The analog-to-digital converter 115 converts the analog signal received from the low pass filter 114 into a digital signal. The digital filter 116 may remove noise from the signal received from the analog-to-digital converter 115 to output the sensing signal SS1. The sensing signal SS1 may be provided to the control circuit 130 illustrated in FIGS. 8A and 8B.

Figure 11:
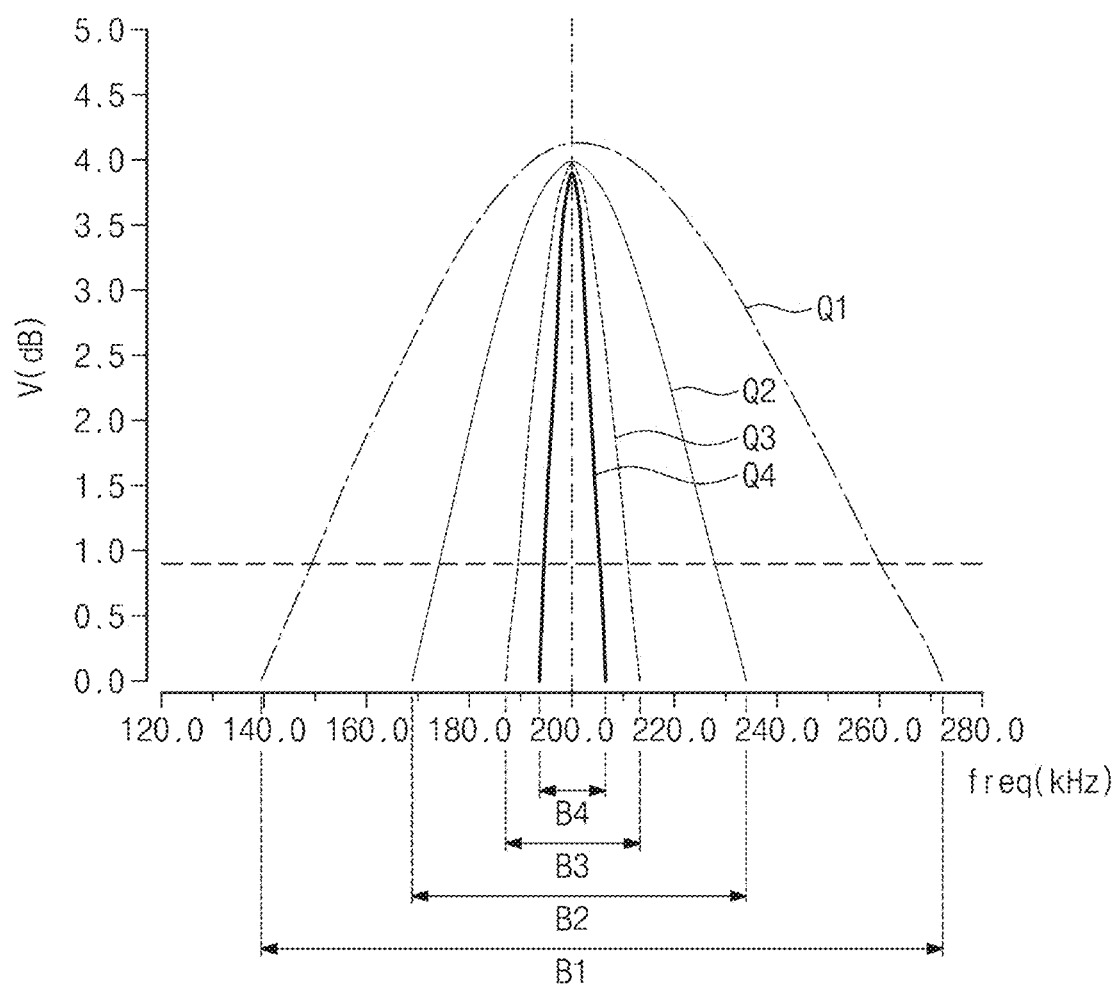
FIG. 11 is a diagram illustrating characteristics of a band pass filter.

FIG. 11 is a diagram illustrating characteristics of a band pass filter.

Referring to FIGS. 10 and 11, the passband of the band pass filter 112 may be determined according to the level of the Q factor signal QF provided to the band pass filter 112.

In FIG. 11, the Q factor levels Q1, Q2, Q3, and Q4 of the Q factor signal QF have a relationship of Q1<Q2<Q3<Q4. When the Q factor levels Q1, Q2, Q3, Q4 have the relationship of Q1<Q2<Q3<Q4, the passband of the band pass filter 112 is B4<B3<B2<B1. That is, as the Q factor level of the Q factor signal QF increases, the passband of the band pass filter 112 may become narrower. The x-axis of FIG. 11 may represent the frequency of the passband and the y-axis of FIG. 11 may represent a signal to noise ratio.

As the passband of the band pass filter 112 becomes narrower, the noise removal performance of the band pass filter 112 may be increased.

Figure 12:
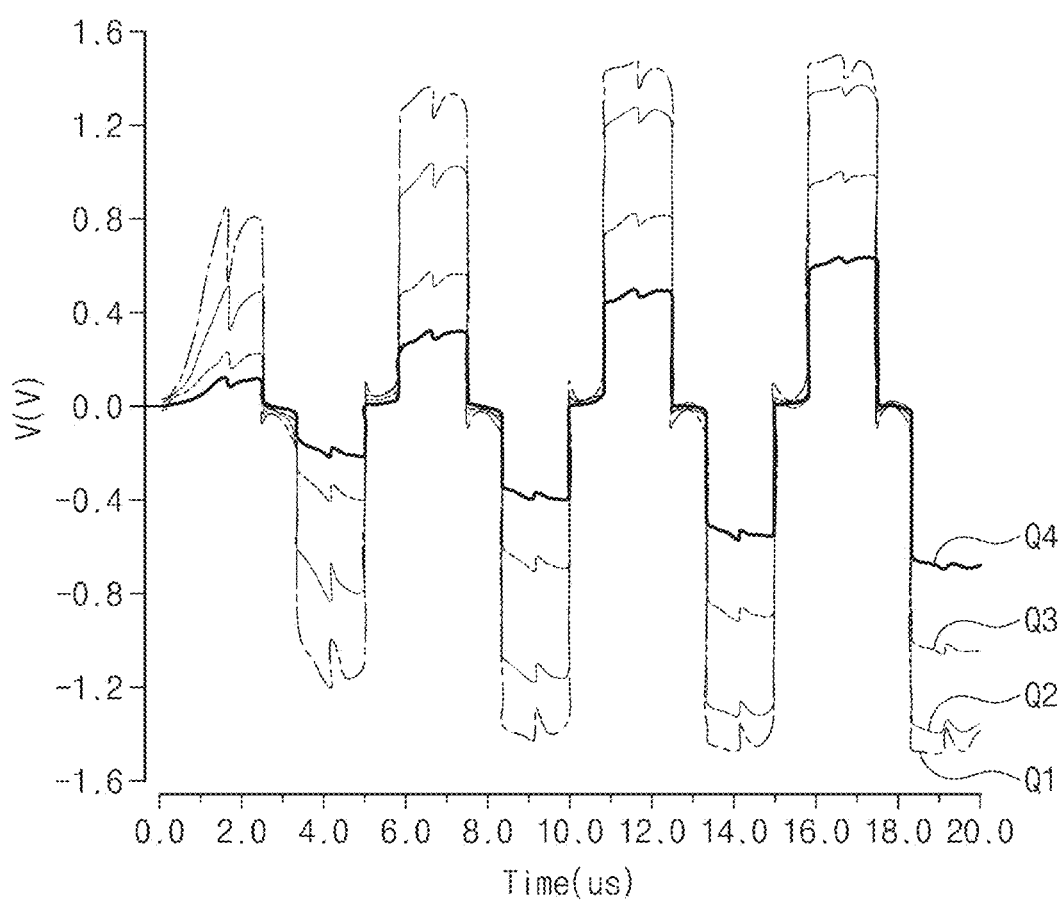
FIG. 12 illustrates a delay of an output signal of a band pass filter according to a Q factor level of a Q factor signal.

FIG. 12 illustrates a delay of an output signal of the band pass filter 112 according to a Q factor level of the Q factor signal QF.

Referring to FIGS. 10, 11 and 12, it may be seen that as the Q factor level of the Q factor signal QF increases, the delay time for the output signal of the band pass filter 112 to reach a predetermined voltage level increases. That is, when the delay times corresponding to the Q factor levels Q1, Q2, Q3, and Q4 respectively are t1, t2, t3, and t4, and when the Q factor levels have a relationship of Q1<Q2<Q3<Q4, the delay times of the output signal of the band pass filter 112 are t1<t2<t3<t4.

That is, as the passband of the band pass filter 112 becomes narrower, the noise removal performance of the band pass filter 112 is increased, but the delay time of the output signal of the band pass filter 112 is increased. Thus the Q factor level of the Q factor signal QF may not be set blindly high.

In one embodiment of the present disclosure, during the first sensing mode, effective transmitting electrodes are selected from among the first to fourteenth transmitting electrodes TE1 to TE14, and during the second sensing mode, the transmitter 120 transmits transmitting signals to the effective transmitting electrodes among the first to fourteenth transmitting electrodes TE1 to TE14 in response to the control of the control circuit 130. When the number of effective transmitting electrodes is less than the number of the first to fourteenth transmitting electrodes TE1 to TE14, a time for providing the transmitting signals to each of the effective transmitting electrodes may be sufficiently secured. By setting the Q factor level of the Q factor signal QF according to the number of effective transmitting electrodes among the first to fourteenth transmitting electrodes TE1 to TE14, while maximizing the noise removal effect, it is possible to minimize performance degradation due to the delay time of the signal output from the band pass filter 112.

Figure 13:
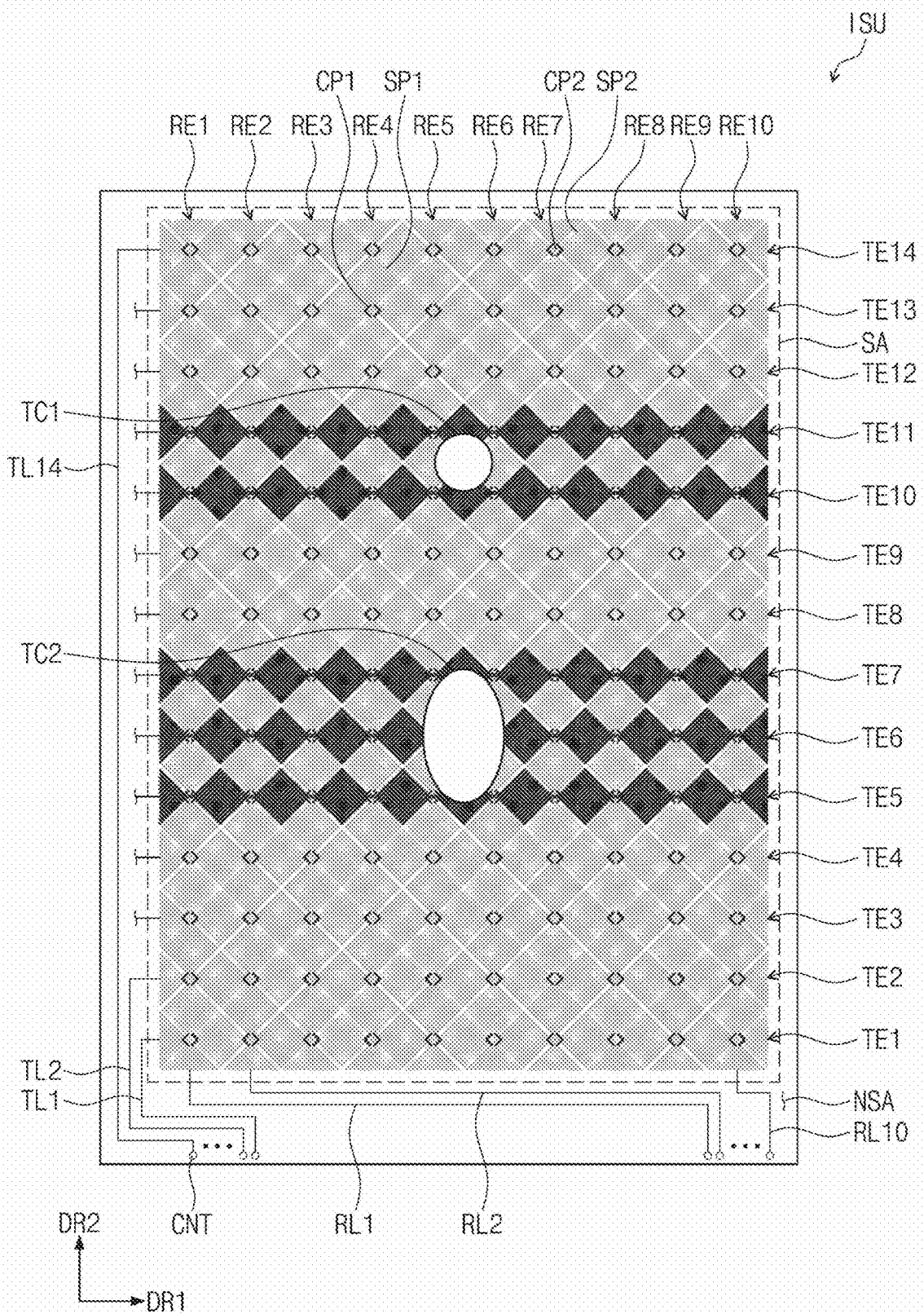
FIG. 13 is a diagram describing an operation of an input sensor during a first section of a first sensing mode.

FIG. 13 is a diagram describing an operation of an input sensor during a first section SSM1-1 of a first sensing mode.

Figure 14:
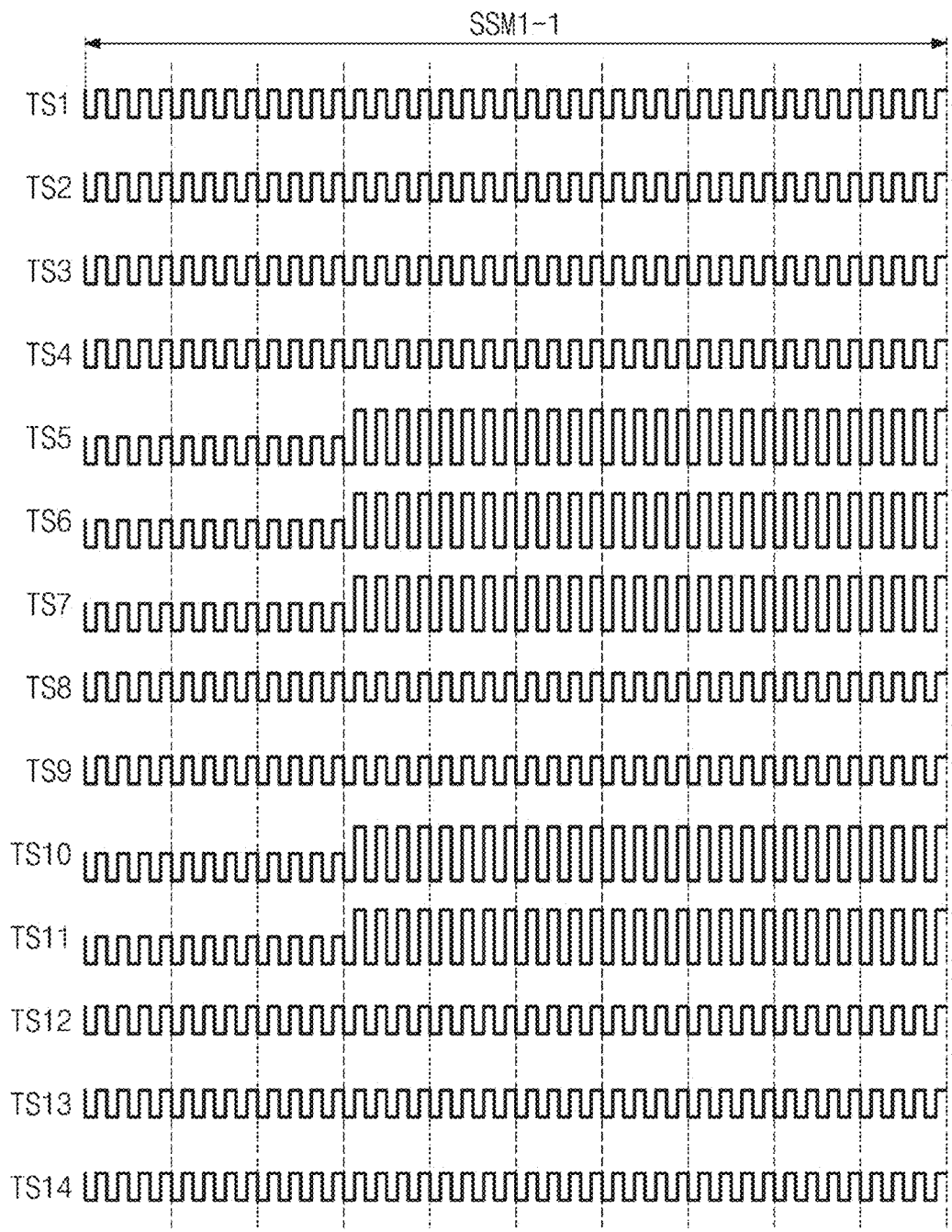
FIG. 14 is a timing diagram describing an operation of an input sensor illustrated in FIG. 13.

FIG. 14 is a timing diagram describing an operation of an input sensor illustrated in FIG. 13.

Referring to FIGS. 8A, 13, and 14, during the first section SSM1-1 of the first sensing mode, the readout circuit ROC may sense a change in capacitance of the first to fourteenth transmitting electrodes TE1 to TE14.

When a first input TC1 and a second input TC2 of a user are input during the first section SSM1-1 of the first sensing mode, the capacitance of the fifth, sixth, seventh, tenth and eleventh transmitting electrodes TE5, TE6, TE7, TE10, and TE11 changes. As the capacitance of the fifth, sixth, seventh, tenth, and eleventh transmitting electrodes TE5, TE6, TE7, TE10, and TE11 changes, a signal waveform (or a voltage level) of the fifth, sixth, seventh, tenth, and eleventh transmitting signals TS5, TS6, TS7, TS10, and TS11 among the first to fourteenth transmitting signals TS1 to TS14 changes.

The readout circuit ROC may select the fifth, sixth, seventh, tenth, and eleventh transmitting electrodes TE5, TE6, TE7, TE10, and TE11 as the effective transmitting electrodes, based on the change in capacitance of the fifth, sixth, seventh, tenth, and eleventh transmitting electrodes TE5, TE6, TE7, TE10, and TE11 in the first section SSM1-1 of the first sensing mode, that is, the change in the signal waveform of the fifth, sixth, seventh, tenth, and eleventh transmitting signals TS5, TS6, TS7, TS10, and TS11. For example, the readout circuit ROC may select a transmitting electrode as an effective transmitting node when its change in capacitance exceeds a predefined threshold.

Figure 15:
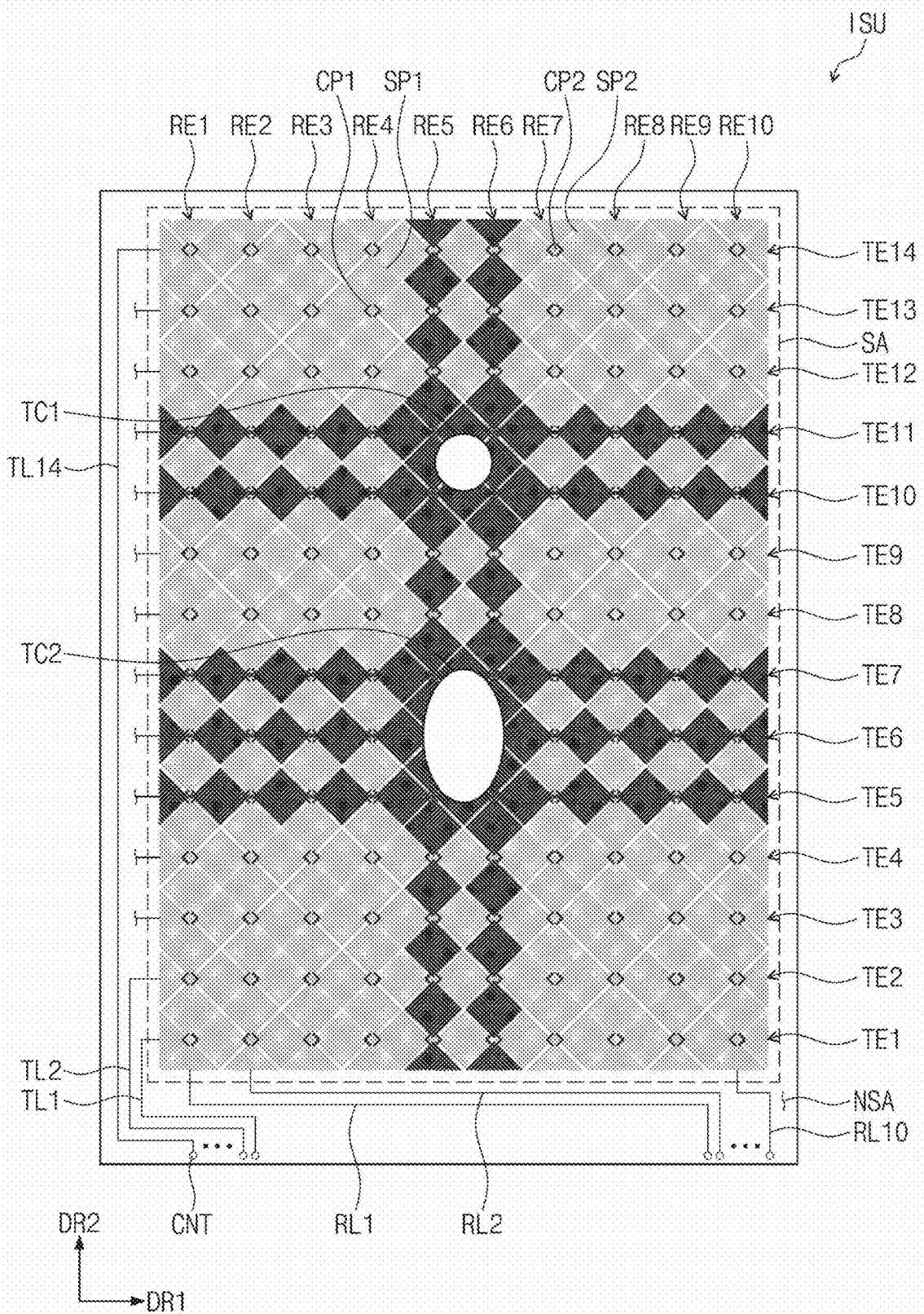
FIG. 15 is a diagram describing an operation of an input sensor during a second section of a first sensing mode.

FIG. 15 is a diagram describing an operation of an input sensor during a second section SSM1-2 of a first sensing mode.

Figure 16:
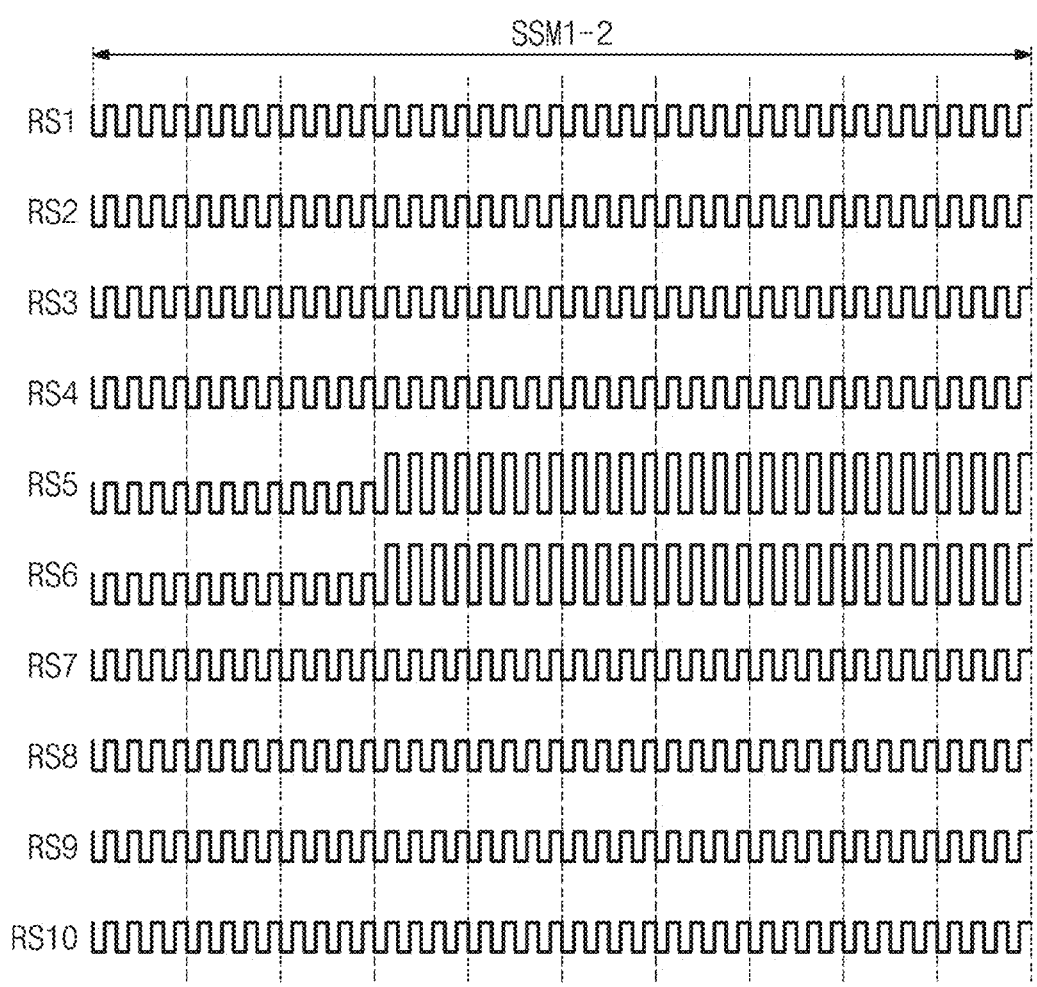
FIG. 16 is a timing diagram describing an operation of an input sensor illustrated in FIG. 15.

FIG. 16 is a timing diagram describing an operation of an input sensor illustrated in FIG. 15.

Referring to FIGS. 8A, 15, and 16, during the second section SSM1-2 of the first sensing mode, the readout circuit ROC may sense a change in capacitance of the first to tenth receiving electrodes RE1 to RE10 as well as the first to fourteenth transmitting electrodes TE1 to TE14.

When the first input TC1 and the second input TC2 of the user are input, the capacitance of the fifth and sixth receiving electrodes RE5 and RE6 change. The signal waveform (or the voltage level) of the fifth and sixth receiving signals RS5 and RS6 among the first to tenth receiving signals RS1 to RS10 due to a change in capacitance of the fifth and sixth receiving electrodes RE5 and RE6 changes.

The readout circuit ROC may select the fifth, sixth, seventh, tenth, and eleventh transmitting electrodes TE5, TE6, TE7, TE10, and TE11 as the effective transmitting electrodes, based on the change in the signal waveform of the fifth, sixth, seventh, tenth, and eleventh transmitting signals TS5, TS6, TS7, TS10, and TS11 in the first section SSM1-1 of the first sensing mode illustrated in FIG. 14, and based on the change in the signal waveform of the fifth and sixth receiving signals RS5 and RS6 in the second section SSM1-2 of the first sensing mode illustrated in FIG. 16.

In an embodiment, the first sensing mode may include only the first section SSM1-1. That is, the readout circuit ROC may select the fifth, sixth, seventh, tenth, and eleventh transmitting electrodes TE5, TE6, TE7, TE10, and TE11 as effective transmitting electrodes, based on the change in capacitance of the fifth, sixth, seventh, tenth, and eleventh transmitting electrodes TE5, TE6, TE7, TE10, and TE11.

In an embodiment, the first sensing mode may include the first section SSM1-1 and the second section SSM1-2. That is, the readout circuit ROC may select the fifth, sixth, seventh, tenth, and eleventh transmitting electrodes TE5, TE6, TE7, TE10, and TE11 as the effective transmitting electrodes, based on the change in capacitance of the fifth and sixth receiving electrodes RE5 and RE6 as well as the fifth, sixth, seventh, tenth, and eleventh transmitting electrodes TE5, TE6, TE7, TE10, and TE11.

Figure 17:
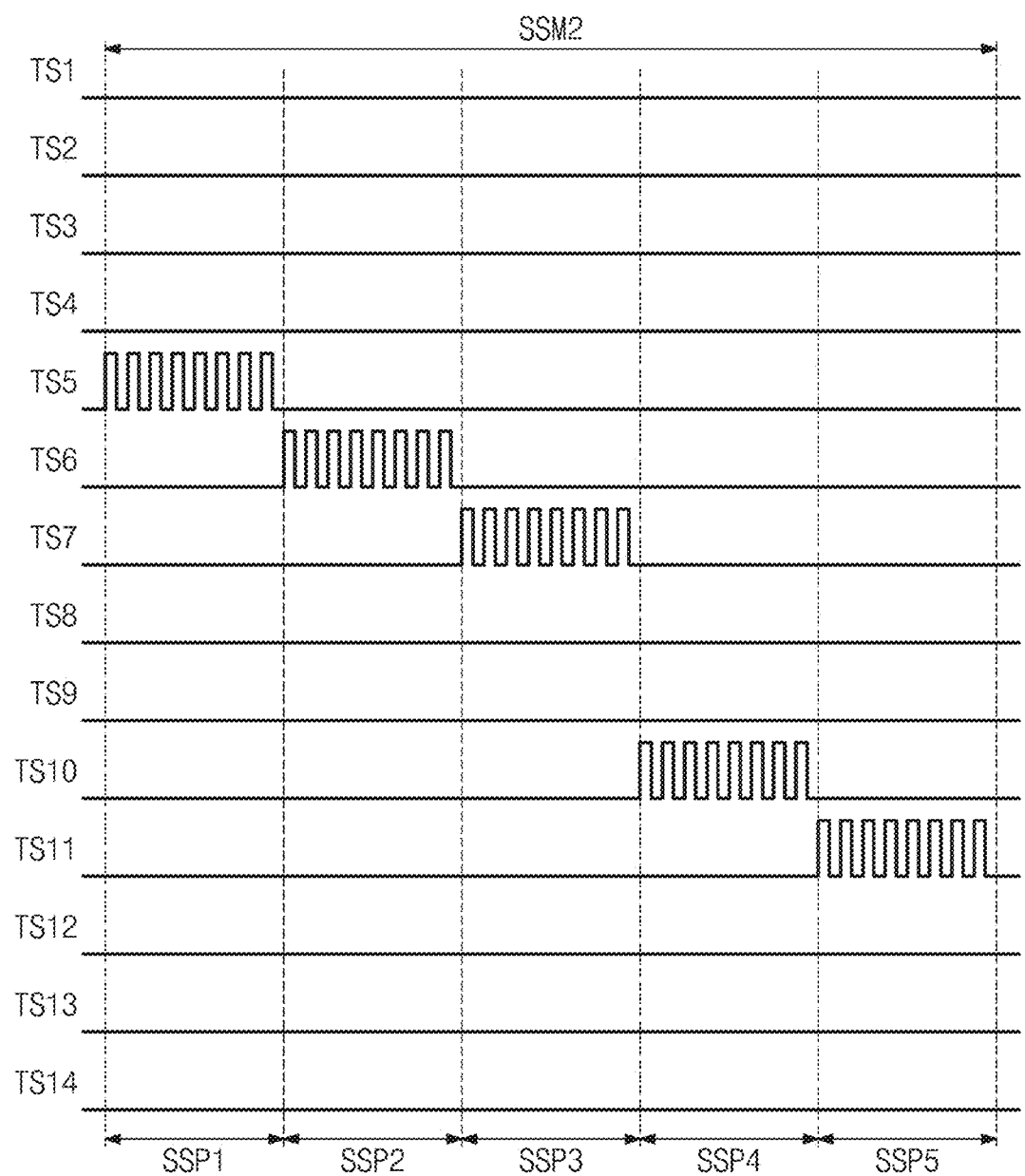
FIG. 17 illustrates first to fourteenth transmitting signals provided to an input sensor during a second sensing mode.

FIG. 17 illustrates first to fourteenth transmitting signals provided to an input sensor during a second sensing mode.

Referring to FIGS. 13 to 17, in a second sensing mode SSM2, the readout circuit ROC outputs the fifth, sixth, seventh, tenth, and eleventh transmitting signals TS5, TS6, TS7, TS10, and TS11 for sensing a touch input to the effective fifth, sixth, seventh, tenth, and eleventh transmitting electrodes TE5, TE6, TE7, TE10, and TE11 (as determined in examples illustrated in FIGS. 13 to 16) among the first to fourteenth transmitting electrodes TE1 to TE14.

The fifth, sixth, seventh, tenth, and eleventh transmitting signals TS5, TS6, TS7, TS10, and TS11 may be pulse signals that swing between predetermined voltage levels in each of the sensing sections SSP1, SSP2, SSP3, SSP4, and SSP5.

In the second sensing mode, the first, second, third, fourth, eighth, ninth, twelfth, thirteenth, and fourteenth transmitting signals TS1, TS2, TS3, TS4, TS8, TS9, TS12, TS13, and TS14 provided to non-effective first, second, third, fourth, eighth, ninth, twelfth, thirteenth, and fourteenth transmitting electrodes TE1, TE2, TE3, TE4, TE8, TE9, TE12, TE13, and TE14 among the first to fourteenth transmitting electrodes TE1 to TE14 may be maintained at a predetermined level (e.g., a ground level).

Figure 18:
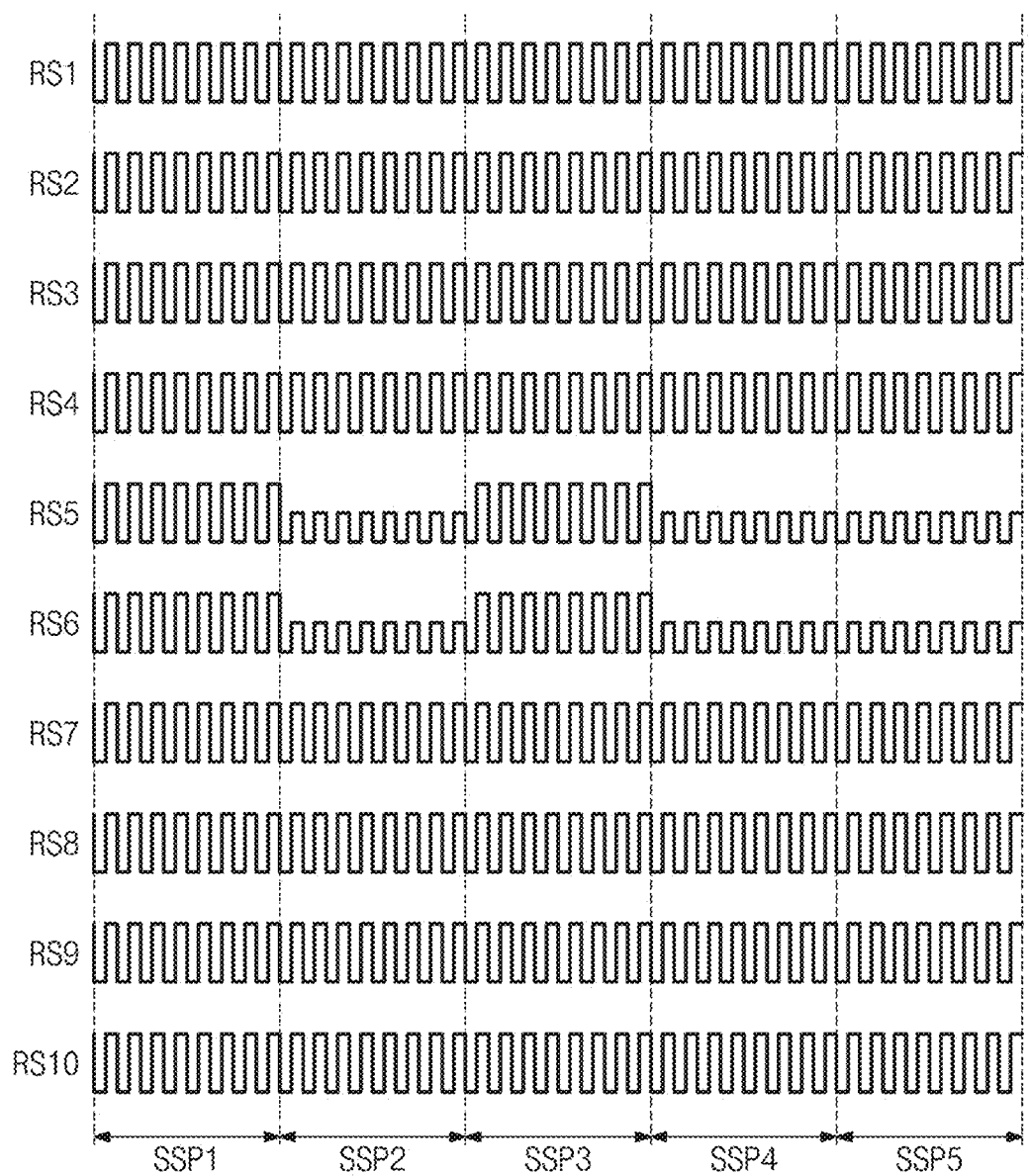
FIG. 18 illustrates first to tenth receiving signals received from an input sensor during a second sensing mode.

FIG. 18 illustrates first to tenth receiving signals received from an input sensor during a second sensing mode.

Referring to FIGS. 13, 17 and 18, during the second sensing mode, the readout circuit ROC receives the first to tenth receiving signals RS1 to RS10 from the first to tenth receiving electrodes RE1 to RE10.

The readout circuit ROC may sense a change in signal waveform of the fifth receiving signal RS5 and the sixth receiving signal RS6 in the second sensing section SSP2, the fourth sensing section SSP4, and the fifth sensing section SSP5 of the second sensing mode.

The readout circuit ROC may sense the intersections between the sixth transmitting electrode TE6 corresponding to the second sensing section SP2 and the fifth receiving electrode RE5 and the sixth receiving electrode RE6 corresponding to the fifth receiving signal RS5 and the sixth receiving signal RS6 as the position of the second input TC2 of the user, and may sense the intersections between the tenth transmitting electrode TE10 and the eleventh transmitting electrode TE1 corresponding to the fourth sensing section SP4 and the fifth sensing section SP5 and the fifth receiving electrode RE5 and the sixth receiving electrode RE6 corresponding to the fifth receiving signal RS5 and the sixth receiving signal RS6 as the position of the first input TC1 of the user.

Figure 19:
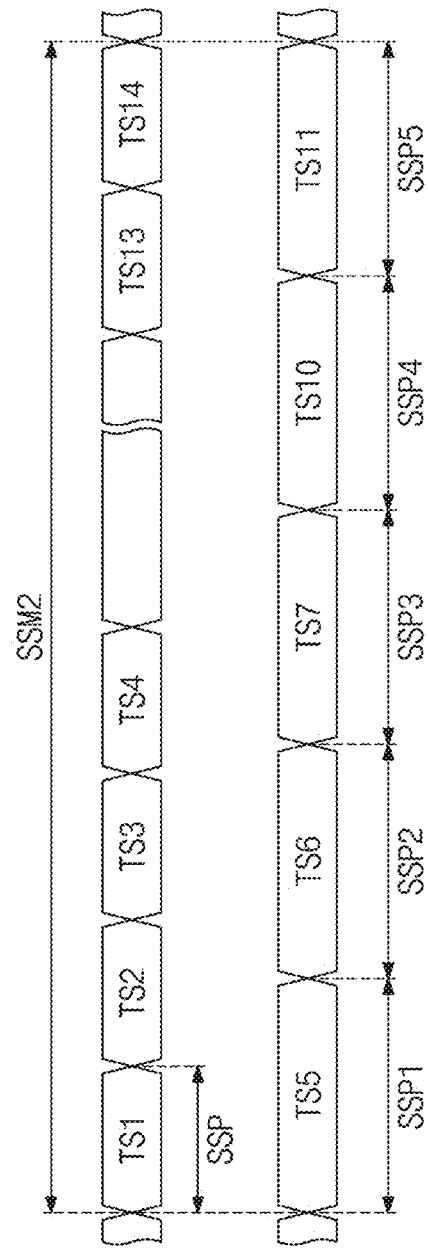
FIG. 19 is a diagram describing an operation of a second sensing mode.

FIG. 19 is a diagram describing an operation of a second sensing mode according to an embodiment of the disclosure.

FIG. 19 illustrates providing the fifth, sixth, seventh, tenth, and eleventh transmitting signals TS5, TS6, TS7, TS10, and TS11 to the effective sensing electrodes among the first to fourteenth transmitting electrodes TE1 to TE14, that is, the fifth, sixth, seventh, tenth, and eleventh transmitting electrodes TE5, TE6, TE7, TE10, and TE11, as compared to providing the first to fourteenth transmitting signals TS1 to TS14 to all of the first to fourteenth transmitting electrodes TE1 to TE14 in the second sensing mode SSM2.

Referring to FIGS. 13 and 19, the readout circuit ROC may provide the first to fourteenth transmitting signals TS1 to TS14 to all of the first to fourteenth transmitting electrodes TE1 to TE14 in the second sensing mode SSM2. In this case, the sensing time of the sensing section SSP in which the first to fourteenth transmitting signals TS1 to TS14 are provided to each of the first to fourteenth transmitting electrodes TE1 to TE14 is shorter than the sensing time of each of the first to fifth sensing sections SSP1 to SSP5.

In other words, in the second sensing mode SSM2, when the fifth, sixth, seventh, tenth, and eleventh transmitting signals TS5, TS6, TS7, TS10, and TS11 are provided to the effective transmitting electrodes, that is, the fifth, sixth, seventh, tenth, and eleventh transmitting electrodes TE5, TE6, TE7, TE10, and TE11, the sensing time of each of the first to fifth sensing sections SSP1 to SSP5 may be sufficiently longer than the sensing time of the sensing section SSP in which the first to fourteenth transmitting signals TS1 to TS14 are respectively provided.

For example, when the sensing time of the second sensing mode SSM2 is 2 ms, the sensing time of the sensing section SSP is 2/14=0.143 ms, and the sensing time of each of the first to fifth sensing sections SSP1 to SSP5 is 2/5=0.4 ms.

Since the number of effective transmitting electrodes is less than the number of the first to fourteenth transmitting electrodes TE1 to TE14, a time for providing the transmitting signals to each of the effective transmitting electrodes may be sufficiently secured. That is, by setting the Q factor level of the Q factor signal QF according to the number of effective transmitting electrodes among the first to fourteenth transmitting electrodes TE1 to TE14, while maximizing the noise removal effect, it is possible to minimize performance degradation due to the delay time of the signal output from the band pass filter 112 (refer to FIG. 10).

Figure 20:
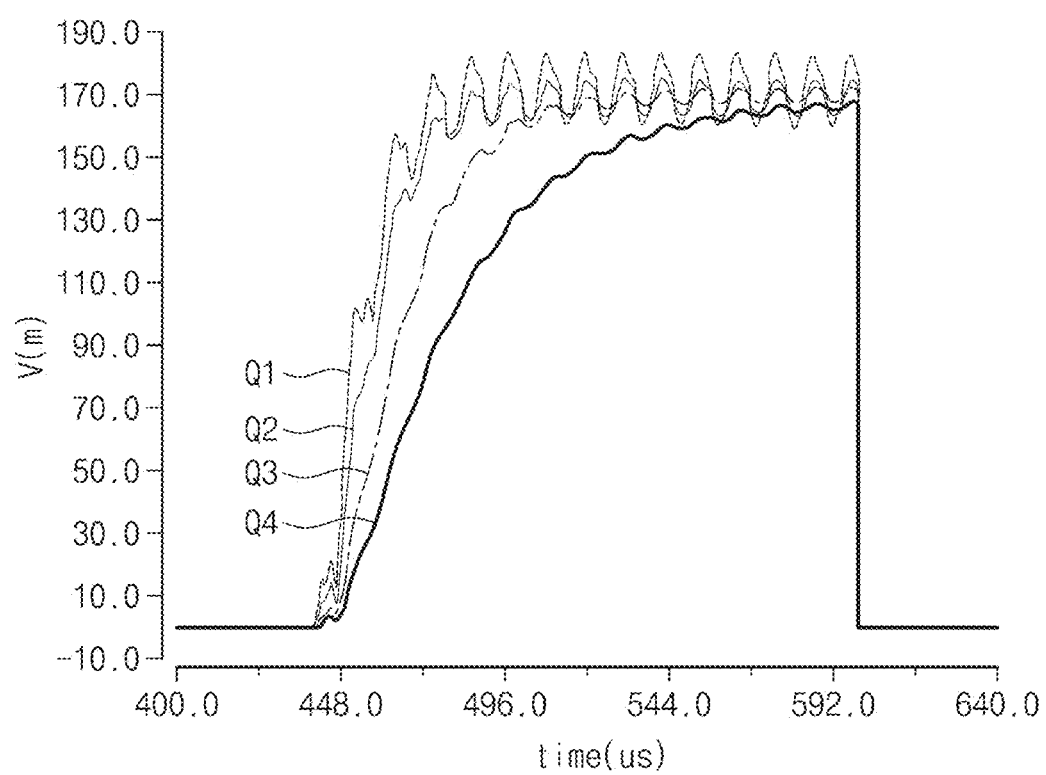
FIG. 20 illustrates a signal output from a low pass filter illustrated in FIG. 10.

FIG. 20 illustrates a signal output from a low pass filter illustrated in FIG. 10.

Referring to FIGS. 10 and 20, the noise components included in a signal output from the low pass filter 114 may vary depending on the Q factor levels Q1, Q2, Q3, Q4 of the Q factor signal QF provided to the band pass filter 112.

When the Q factor level of the Q factor signal QF has the relationship Q1<Q2<Q3<Q4, as the Q factor level increases, the delay time of the signal output from the low pass filter 114 increases, but the noise components decreases.

That is, as the Q factor level of the Q factor signal QF increases, the noise component included in the sensing signals SS1 to SS10 output from the first to tenth receiving units 11 to 20 (refer to FIG. 9) may be minimized.

Figure 21:
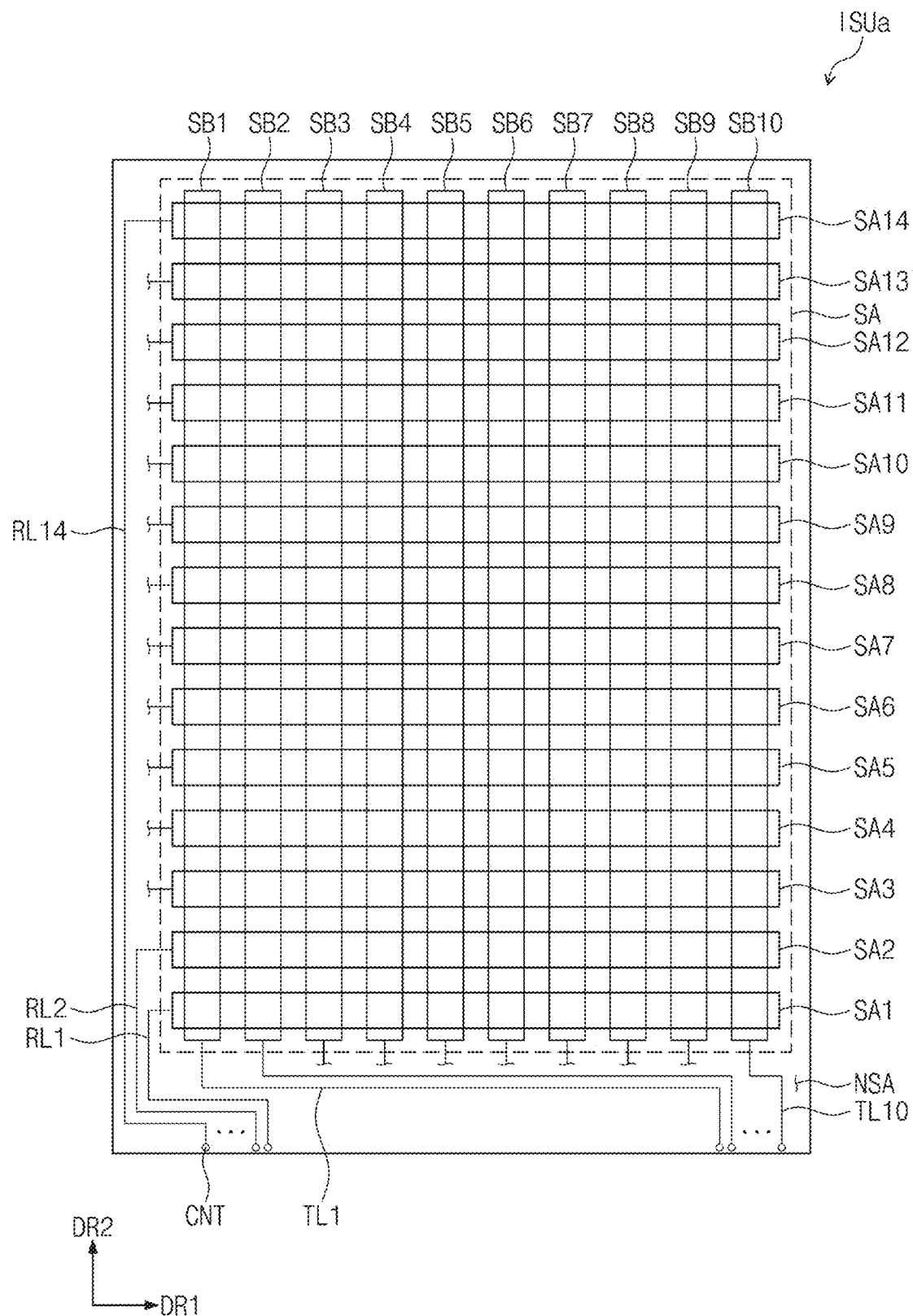
FIG. 21 is a diagram illustrating an input sensor according to an embodiment of the present disclosure.

FIG. 21 is a diagram illustrating an input sensor ISUa according to an embodiment of the present disclosure. The input sensor ISU of FIG. 5 may be replaced with the input sensor ISUa of FIG. 21.

Referring to FIG. 21, the first sensing electrodes SA1 to SA14 and the second sensing electrodes SB1 to SB10 may be disposed in the sensing area SA. The first sensing electrodes SA1 to SA14 may extend in the first direction DR1 and may be arranged to be spaced apart from each other in the second direction DR2. Each of the second sensing electrodes SB1 to SB10 may extend in the second direction DR2 and may be arranged to be spaced apart from each other in the first direction DR1. The second sensing electrodes SB1 to SB10 may be arranged to cross the first sensing electrodes SA1 to SA14. The first sensing electrodes SA1 to SA14 and the second sensing electrodes SB1 to SB10 are insulated from each other.

The first sensing electrodes SA1 to SA14 are electrically connected to the first to fourteenth receiving lines RL1 to RL14. The second sensing electrodes SB1 to SB10 are electrically connected to the first to tenth transmitting lines TL1 to TL10.

The input sensor ISUa illustrated in FIG. 21 may operate in the same manner as the input sensor ISU illustrated in FIG. 7.

Figure 22:
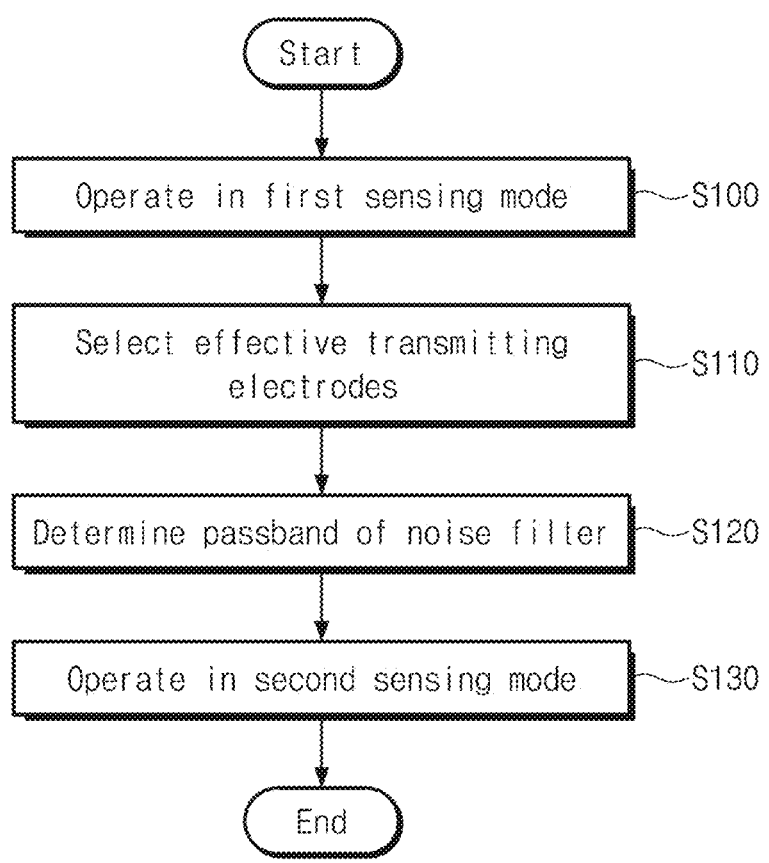
FIG. 22 is a flowchart illustrating an operating method of a display device according to an embodiment of the present disclosure.

FIG. 22 is a flowchart illustrating an operating method of a display device according to an embodiment of the disclosure.

In the following description, an operating method of the display device will be described with reference to the readout circuit illustrated in FIGS. 8A and 8B, but the present disclosure is not limited thereto.

Referring to FIGS. 8A, 8B and 22, the readout circuit ROC operates in the first sensing mode (operation S100). In the first sensing mode, the receiver 110 of the readout circuit ROC receives a receiving signal from the first to fourteenth transmitting electrodes TE1 to TE14 illustrated in FIG. 7.

The passband of the band pass filter 112 (refer to FIG. 10) in the receiver 110 may be determined based on the number of the first to fourteenth transmitting electrodes TE1 to TE14.

The control circuit 130 of the readout circuit ROC selects effective transmitting electrodes from among the first to fourteenth transmitting electrodes TE1 to TE14 based on the sensing signals from the receiver 110 (operation S110). For example, the control circuit 130 may determine which of the transmitting electrodes TE1 to TE14 are being affected by a touch as the effective transmitting electrodes.

The control circuit 130 of the readout circuit ROC determines the passband of the band pass filter 112 in the receiver 110 based on the number of effective transmitting electrodes (operation S120). The control circuit 130 provides the Q factor signal QF corresponding to the determined passband to the band pass filter 112 in the receiver 110. In an embodiment, the passband is set to a first range (e.g., B1) when the number of effective transmitting electrodes is a first value and the passband is set to a second range (e.g., B4) smaller than the first range when the number of effective transmitting electrodes is a second value less than the first value.

The readout circuit ROC operates in the second sensing mode (operation S130). In the second sensing mode, the transmitter 120 of the readout circuit ROC transmits a transmitting signal to the first to fourteenth transmitting electrodes TE1 to TE14, the receiver 110 receives a receiving signal from the first to tenth receiving electrodes RE1 to RE10 illustrated in FIG. 7.

In this case, since the passband of the band pass filter 112 in the receiver 110 is determined depending on the number of effective transmitting electrodes among the first to fourteenth transmitting electrodes TE1 to TE14, it is possible to minimize signal loss due to signal delay while noise sufficiently is removed.

In an embodiment, a display device is provided including a display panel, a touch sensor, and a readout circuit. The touch sensor includes a plurality of transmitting electrodes and a plurality of receiving electrodes. The readout circuit includes a noise filter connected to the transmitting electrodes and the receiving electrodes for receiving a receiving signal. The readout circuit determines which of the transmitting electrodes are influenced by a touch based on the receiving signal as influenced electrodes, during a first sensing mode. The readout circuit adjusts a passband of the noise filter based on the number of influenced electrodes and transmits a transmitting signal to the influenced electrodes, during a second sensing mode. The transmitting signal transmitted to the influenced electrodes may include pulses that swing between a logic high and a logic low. The remaining transmitting electrodes may receive a constant voltage different from the transmitting signals transmitted to the influenced electrodes. In an embodiment, the first sensing mode is a self-capacitance mode where the input sensor ISU or ISUa is as operated as a self-capacitive touchscreen and the second sensing mode is a mutual-capacitance mode where the input sensor ISU or ISUa is as operated as a mutual-capacitive touchscreen.

According to an embodiment of the present disclosure, the display device having such a configuration senses a touch input and selects valid sensing lines during a first sensing mode. A touch sensing time for each of the valid sensing lines may be sufficiently secured by sensing a touch input through the valid sensing lines during the second sensing mode. Therefore, since a Q factor of the noise filter may be set high, the performance of the noise filter may be increased. As a result, a touch sensing performance of the display device may be increased.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display device comprising:
   a display panel;
   an input sensor disposed on the display panel and comprising a plurality of first sensing electrodes and a plurality of second sensing electrodes; and
   a readout circuit comprising a band pass filter electrically connected to the plurality of first sensing electrodes and the plurality of second sensing electrodes to remove noise of a receiving signal received from the plurality of first sensing electrodes and the plurality of second sensing electrodes,
   wherein the readout circuit determines which of the first sensing electrodes from among the plurality of first sensing electrodes are influenced by a touch based on the receiving signal as influenced electrodes, during a first sensing mode, and
   wherein the readout circuit adjusts a passband of the band pass filter based on the number of influenced electrodes and transmits a transmitting signal to the influenced electrodes, during a second sensing mode.

2. The display device of claim 1, wherein as the number of influenced electrodes decreases, the passband of the band pass filter becomes narrower.

3. The display device of claim 1, wherein the readout circuit provides a Q factor signal to the band pass filter based on the number of influenced electrodes, and wherein as a Q factor level of the Q factor signal becomes high, the passband of the band pass filter becomes narrower.

4. The display device of claim 1, wherein the readout circuit comprises:
   a receiver which receives the receiving signal from the plurality of first sensing electrodes and the plurality of second sensing electrodes to output a sensing signal;
   a transmitter which transmits the transmitting signal to the influenced electrodes; and a control circuit which controls the receiver and the transmitter, and wherein the control circuit determines the influenced electrodes from among the plurality of first sensing electrodes based on the sensing signal.

5. The display device of claim 4, wherein the receiver includes the band pass filter which removes noise of the receiving signal in response to a Q factor signal, and wherein the control circuit provides the Q factor signal to the band pass filter based on the number of influenced electrodes.

6. The display device of claim 4, wherein the receiver receives the receiving signal from the plurality of first sensing electrodes during the first sensing mode.

7. The display device of claim 4, wherein the receiver receives the receiving signal from the plurality of first sensing electrodes during a first section of the first sensing mode, and receives the receiving signal from the plurality of second sensing electrodes during a second section of the first sensing mode.

8. The display device of claim 4, further comprising:
   first sensing lines electrically connecting the plurality of first sensing electrodes to the readout circuit; and
   second sensing lines electrically connecting the plurality of second sensing electrodes to the readout circuit.

9. The display device of claim 1, wherein the passband of the band pass filter is a first range when the number of influenced electrodes is a first value and a second range smaller than the first range when the number is a second value less than the first value.

10. A display device comprising:
    a display panel;
    an input sensor disposed on the display panel and comprising a plurality of first sensing electrodes and a plurality of second sensing electrodes; and
    a readout circuit comprising a band pass filter electrically connected to the plurality of first sensing electrodes and the plurality of second sensing electrodes to remove noise of a receiving signal received from the plurality of first sensing electrodes and the plurality of second sensing electrodes, and
    wherein the readout circuit determines which of the first sensing electrodes from among the plurality of first sensing electrodes are influenced by a touch based on the receiving signal as influenced electrodes, during a first sensing mode,
    wherein the readout circuit transmits a transmitting signal to the influenced electrodes during a second sensing mode, sets a Q factor of the band pass filter during the first sensing mode is at to a first level, and sets the Q factor of the band pass filter during the second sensing mode is at to a second level determined from the number of the influenced electrodes.

11. The display device of claim 10, wherein the second level is the same as the first level.

12. The display device of claim 10, wherein the second level is different from the first level.

13. The display device of claim 10, wherein the readout circuit comprises:
    a receiver which receives the receiving signal from the plurality of first sensing electrodes and the plurality of second sensing electrodes and to output a sensing signal;
    a transmitter which transmits the transmitting signal to the influenced electrodes; and
    a control circuit which controls the receiver and the transmitter, and wherein the control circuit determined the influenced electrodes from among the plurality of first sensing electrodes based on the sensing signal.

14. The display device of claim 13, wherein the receiver receives the receiving signal from the plurality of first sensing electrodes during the first sensing mode.

15. The display device of claim 13, wherein the receiver receives the receiving signal from the plurality of first sensing electrodes during a first section of the first sensing mode, and receives the receiving signal from the plurality of second sensing electrodes during a second section of the first sensing mode.

16. A method of operating a display device which includes an input sensor and a readout circuit, the method comprising:
    receiving a receiving signal from a plurality of first sensing electrodes and a plurality of second sensing electrodes of the input sensor; determining which of the first sensing electrodes from among the plurality of first sensing electrodes are influenced by a touch as influenced electrodes;
    adjusting a passband of a band pass filter of the readout circuit based on the number of influenced electrodes; and
    transmitting a transmitting signal to the influenced electrodes.

17. The method of claim 16, wherein as the number of influenced electrodes decreases, the passband of the band pass filter becomes narrower.

18. The method of claim 16, wherein the readout circuit provides a Q factor signal to the band pass filter based on the number of influenced electrodes, and wherein as a Q factor level of the Q factor signal becomes high, the passband of the band pass filter becomes narrower.

19. The method of claim 16, wherein the adjusting comprises:
setting the passband to a first range when the number of influenced electrodes is a first value; and
setting the passband to a second range lower than the first range when the number is a second value less than the first value.

20. A display device comprising:
a display panel;
a touch sensor disposed on the display panel and comprising a plurality of transmitting electrodes and a plurality of receiving electrodes; and
a readout circuit comprising a band pass filter electrically connected to the transmitting electrodes and the receiving electrodes for receiving a receiving signal,
wherein the readout circuit determines which of the transmitting electrodes are influenced by a touch based on the receiving signal as influenced electrodes, during a first sensing mode, and
wherein the readout circuit adjusts a passband of the band pass filter based on the number of influenced electrodes and transmits a transmitting signal to the influenced electrodes, during a second sensing mode.

21. The display device of claim 20, wherein the touch sensor operates in a self-capacitive manner during the first sensing mode and operates in a mutual-capacitive manner during the second sensing mode.

* * * * *